(12) United States Patent
Kim et al.

(10) Patent No.: US 9,490,001 B2
(45) Date of Patent: Nov. 8, 2016

(54) SEMICONDUCTOR MEMORY DEVICE THAT CONTROLS REFRESH PERIOD, MEMORY SYSTEM AND OPERATING METHOD THEREOF

(71) Applicants: Jung-sik Kim, Seoul (KR); Cheol Kim, Seoul (KR); Sang-ho Shin, Yongin-si (KR)

(72) Inventors: Jung-sik Kim, Seoul (KR); Cheol Kim, Seoul (KR); Sang-ho Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 163 days.

(21) Appl. No.: 13/937,747

(22) Filed: Jul. 9, 2013

(65) Prior Publication Data

US 2014/0016422 A1    Jan. 16, 2014

(30) Foreign Application Priority Data

Jul. 12, 2012    (KR) .................. 10-2012-0076280

(51) Int. Cl.
| | | |
|---|---|---|
| *G11C 11/40* | (2006.01) | |
| *G11C 11/406* | (2006.01) | |
| *G11C 7/00* | (2006.01) | |
| *G11C 11/402* | (2006.01) | |
| *G11C 11/408* | (2006.01) | |

(52) U.S. Cl.
CPC .............. *G11C 11/406* (2013.01); *G11C 7/00* (2013.01); *G11C 11/402* (2013.01); *G11C 11/408* (2013.01); *G11C 11/40603* (2013.01); *G11C 11/40622* (2013.01); *G11C 2211/406* (2013.01)

(58) Field of Classification Search
CPC .............. G11C 11/402; G11C 11/406; G11C 11/40603; G11C 11/40622; G11C 2211/406
See application file for complete search history.

(56) References Cited

U.S. PATENT DOCUMENTS

| | | | |
|---|---|---|---|
| 6,167,484 A | 12/2000 | Boyer et al. | |
| 6,195,300 B1 * | 2/2001 | Kirihata | G11C 11/406 365/200 |
| 7,095,669 B2 | 8/2006 | Oh | |
| 7,317,648 B2 | 1/2008 | Jo | |
| 7,836,374 B2 | 11/2010 | Klein | |
| 7,872,929 B2 | 1/2011 | Dell et al. | |
| 8,873,324 B2 * | 10/2014 | Park | G11C 11/40618 365/149 |
| 9,058,896 B2 * | 6/2015 | Franceschini | G11C 29/50016 |
| 2006/0256637 A1 * | 11/2006 | Takahashi et al. | 365/222 |
| 2007/0033338 A1 * | 2/2007 | Tsern | 711/106 |
| 2007/0033339 A1 | 2/2007 | Best et al. | |
| 2009/0161459 A1 | 6/2009 | Kohler et al. | |
| 2010/0165773 A1 | 7/2010 | Lim et al. | |
| 2011/0060961 A1 | 3/2011 | Klein | |
| 2011/0161578 A1 * | 6/2011 | Kim et al. | 711/106 |
| 2013/0279284 A1 * | 10/2013 | Jeong | G11C 11/402 365/222 |
| 2013/0282973 A1 * | 10/2013 | Kim | G11C 11/40622 711/106 |

* cited by examiner

*Primary Examiner* — Vanthu Nguyen

(74) *Attorney, Agent, or Firm* — Myers, Bigel & Sibley, P.A.

(57) ABSTRACT

A semiconductor memory device includes a cell array and a refresh controller coupled to the cell array. The refresh controller is configured to insert at least one insertion refresh address in a first refresh address sequence based on address information about the cell array to generate a second refresh address sequence and to apply the second refresh address sequence to the cell array, such that selected cells may be refreshed more frequently without increasing an overall refresh rate.

22 Claims, 17 Drawing Sheets

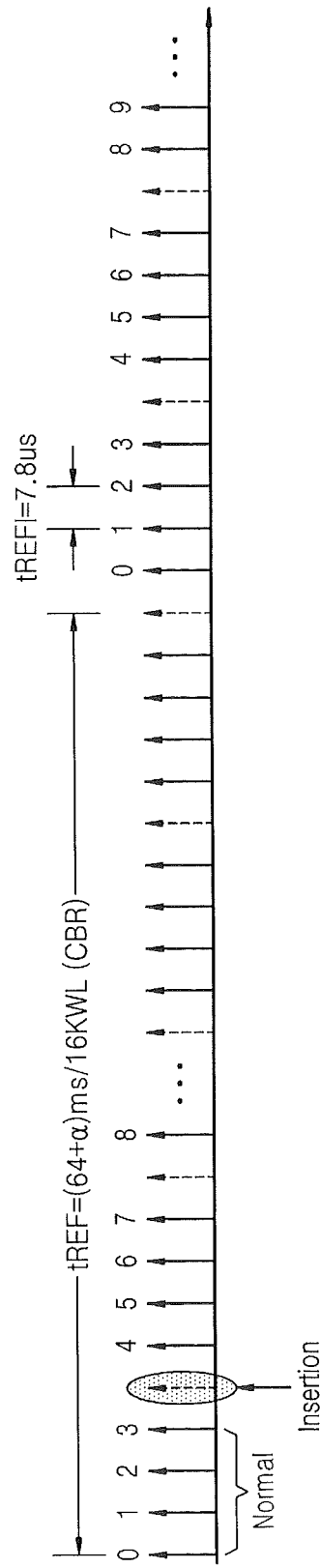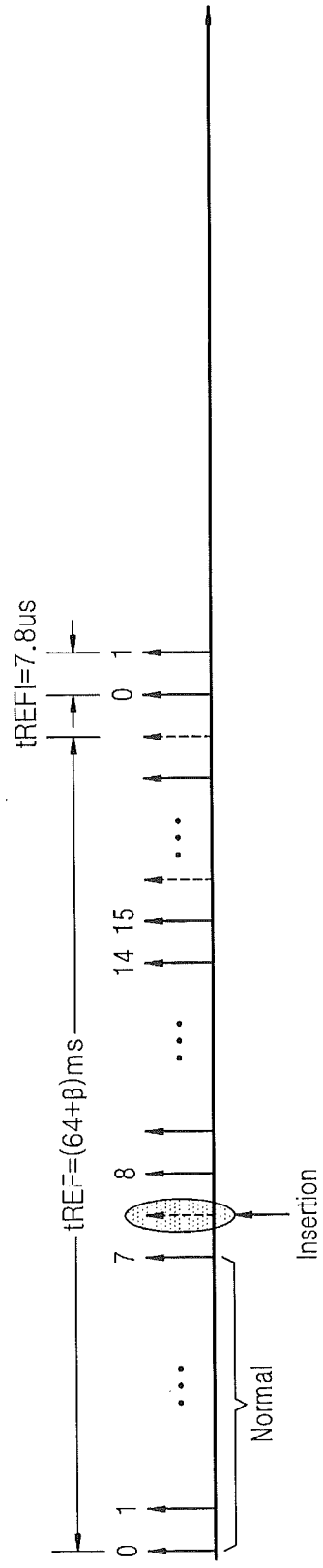

FIG. 4

|  | Normal (64ms/16k) | Normal REF : Insertion REF | | | |
|---|---|---|---|---|---|
|  |  | 2:1 | 4:1 | 8:1 | 16:1 |
| Good Cell tREF | 64ms | 96ms | 80ms | 72ms | 68ms |

SEMICONDUCTOR MEMORY DEVICE THAT CONTROLS REFRESH PERIOD, MEMORY SYSTEM AND OPERATING METHOD THEREOF

CROSS-REFERENCE TO RELATED APPLICATIONS

This application claims the benefit of Korean Patent Application No. 10-2012-0076280, filed on Jul. 12, 2012, in the Korean Intellectual Property Office, the disclosure of which is incorporated herein in its entirety by reference.

BACKGROUND

The inventive concept relates to a semiconductor memory device, and more particularly, to a semiconductor memory device that controls a refresh period and a refreshing method performed by the semiconductor device.

As semiconductor devices have been widely used in high-performance electronic systems, their capacity and speed have increased constantly. Dynamic random access memory (DRAM) that is an example of a semiconductor device is a type of volatile memory that reads data based on charges stored in a capacitor. In time, the charges stored in the capacitor may leak in various ways, so that memory cells of the DRAM have a finite data retention characteristic.

In order to retain data stored in the memory cells, the DRAM periodically performs a refresh operation. A refresh period is a predetermined time period according to specification, and the refresh operation is performed during the refresh period, regardless of technical difficulties of a corresponding process. However, when a DRAM process scaling continues, the technical difficulties of the process for performing the refresh period increase such that a yield rate mass production may deteriorate.

SUMMARY

Some embodiments of the inventive concept provide a semiconductor memory device including a cell array and a refresh controller coupled to the cell array. The refresh controller is configured to insert at least one insertion refresh address in a first refresh address sequence based on address information about the cell array to generate a second refresh address sequence and to apply the second refresh address sequence to the cell array. In this manner, cells with inferior data retention capability may be refreshed more frequently without increasing the refresh rate for other cells.

In some embodiments, the refresh controller includes an address generator configured to generate the at least one insertion refresh address and a timing detector configured to determine a sequence location of the at least one insertion refresh address with respect to the first refresh address sequence and to control the address generator responsive thereto. The refresh controller may further include an address selector configured to receive the first refresh address sequence and the at least one insertion refresh address and to selectively output the at least one insertion refresh address and an address from the first refresh address sequence responsive to the timing detector. In some embodiments, the timing detector may include a first counter configured to perform a counting operation in response to a refresh control signal and to output a first signal when a first value is counted and a second counter configured to perform a counting operation in response to the first signal and to output a second signal to access address information stored by the address generator.

The address generator may be configured to store an address of a cell region having a relatively inferior data retention characteristic and may output the stored address information as the at least one insertion refresh address. The address generator may be further configured to store master information indicating whether to perform the insertion refresh operation. The refresh controller may further include an enable controller configured to receive the master information and to enable and disable refresh address insertion according to a state of the master information.

The cell array may include N-cell groups, and each of the N-cell groups may comprise a plurality of cell regions. The refresh controller may store address information about a number of cells less than N. During one refresh period, the refresh controller may refresh each cell of an N-cell group at least once and refresh less than N cells at least twice. Each of the plurality of cell regions may be a page that is selected in response to one row address.

In some embodiments, the refresh controller may further include a command decoder configured to generate an internal refresh command by decoding an external command and a refresh control circuit configured to generate a refresh control signal in response to the internal refresh command.

According to an aspect of the inventive concept, there is provided a semiconductor memory device including a cell array including a plurality of cell regions; an address counter generating a first refresh address for designating a cell region wherein a refresh operation is to be performed in response to a refresh control signal; and an address generator storing one or more pieces of address information about some cell regions of the plurality of cell regions, and outputting at least one of the stored address information as a second refresh address so as to perform an insertion refresh operation on at least one cell region while the refresh operation is performed by the first refresh address.

According to another aspect of the inventive concept, there is provided a semiconductor memory device including a memory cell array including n-cell regions (where, N is an integer equal to or greater than 2); an address counter generating a first refresh address for designating the n-cell regions, during a refresh period; an address generator outputting a second refresh address for designating at least one cell region from among the n-cell regions, during the refresh period; and an address selector receiving the first and second refresh addresses, and selectively outputting one of the first and second refresh addresses.

According to another aspect of the inventive concept, there is provided a semiconductor memory device including a cell array including a plurality of cell regions; a first counter generating a first refresh address for designating a cell region wherein a normal refresh operation is to be performed in response to a refresh control signal; a timing detector detecting insertion refresh timing with respect to at least one cell region while the normal refresh operation is performed by the first refresh address; and a storing unit storing first information about an address of the at least one cell region to which an insertion refresh operation is to be performed, and second information indicating whether to actually perform the insertion refresh operation during the insertion refresh timing.

According to another aspect of the inventive concept, there is provided a refreshing method performed by a semiconductor memory device including a plurality of cell regions, the refreshing method including operations of performing a first refresh operation on a first cell group including N cell regions, by using a first address based on a counting operation (where, N is an integer equal to or greater than 2); outputting a second address from a storing unit that stores address information about at least one cell region from among the plurality of cell regions; performing a second refresh operation on the at least one cell region by using the second address; and performing a first refresh operation on a second cell group including other N cell regions, by using the first address.

According to another aspect of the inventive concept, there is provided a refreshing method performed by a semiconductor memory device including a-cell groups, each cell group including a plurality of cell regions, the refreshing method including operations of sequentially refreshing cell regions of a first cell group (where, a is an integer equal to or greater than 2); determining whether to perform an insertion refresh operation on a specific cell region by referring to master information; and refreshing the specific cell region according to a result of the determining, wherein, during a refresh period, a refresh operation on the a-cell groups and a refresh operation on one or more specific cell regions are performed.

BRIEF DESCRIPTION OF THE DRAWINGS

Exemplary embodiments of the inventive concept will be more clearly understood from the following detailed description taken in conjunction with the accompanying drawings in which:

FIGS. 2A and 2B illustrate examples in which a refresh operation is performed during one refresh period, according to embodiments of the inventive concept;

FIG. 4 illustrates a table indicating values of a refresh period according to a ratio of a normal refresh operation to an insertion refresh operation;

DETAILED DESCRIPTION

The attached drawings for illustrating exemplary embodiments of the inventive concept are referred to in order to gain a sufficient understanding of the inventive concept, the merits thereof, and the objectives accomplished by the implementation of the inventive concept.

Hereinafter, the inventive concept will be described in detail by explaining exemplary embodiments of the inventive concept with reference to the attached drawings.

A dynamic random access memory (DRAM) as a semiconductor memory device has a finite data retention characteristic. Thus, even a normal memory cell does not guarantee the validity of stored data after a specification time lapses. In order to retain data, a refresh policy is used. In this regard, a refresh operation may include a refresh operation based on an external refresh command and an external refresh address, or an auto-refresh operation or a self-refresh operation, which internally generates a refresh address.

Figure 1:
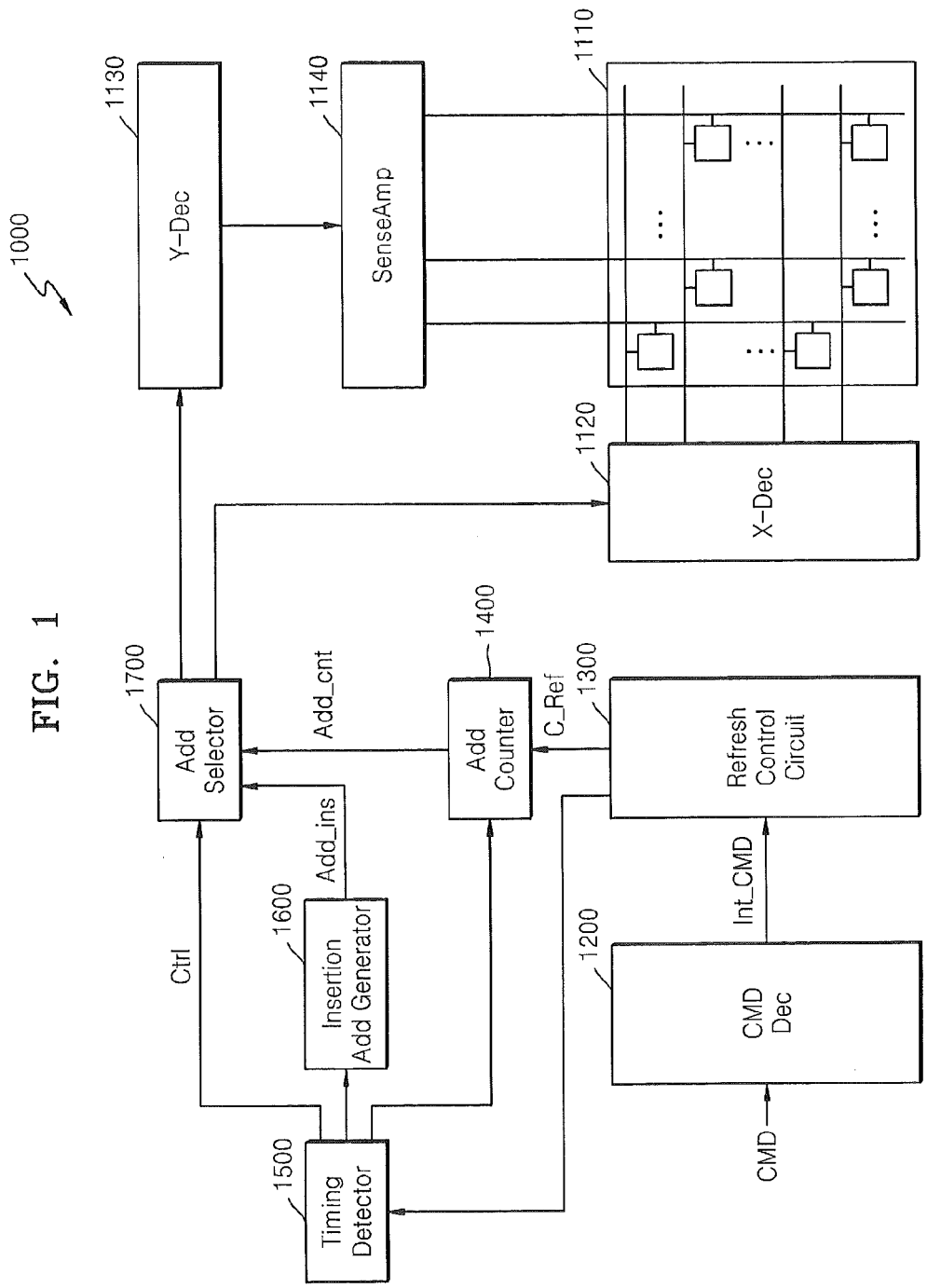
FIG. 1 is a block diagram of a semiconductor memory device according to an embodiment of the inventive concept.

FIG. 1 is a block diagram of a semiconductor memory device 1000 according to an embodiment of the inventive concept. As illustrated in FIG. 1, the semiconductor memory device 1000 may include a cell array 1110, a row decoder 1120 for driving a row of the cell array 1110, a column decoder 1130 for driving a column of the cell array 1110, and a sense amplifier 1140 for sensing and amplifying data. The semiconductor memory device 1000 may include a command decoder 1200, a refresh control circuit 1300, and an address counter 1400 which are peripheral circuits to drive the cell array 1110 or to perform a refresh operation.

The semiconductor memory device 1000 refreshes memory cells included in the cell array 1110 during a refresh period. The cell array 1110 may include a plurality of cell regions. Each of the cell regions may be a page unit designated by a row address. When the cell regions of the cell array 1110 are refreshed, the address counter 1400 sequentially generates refresh addresses to designate the cell regions of the cell array 1110 during a refresh period.

A refresh operation for some of the cell regions which have a relatively inferior data retention characteristic may be additionally inserted (hereinafter, referred to as "insertion refresh operation") during the refresh period, and in order to perform the insertion refresh operation, the semiconductor memory device 1000 may further include a timing detector 1500 and an address generator 1600 (hereafter, it is referred as an insertion address generator). The semiconductor memory device 1000 may further include an address selector 1700. The address selector 1700 receives a first refresh address Add_cnt from the address counter 1400 and a second refresh address Add_ins from the insertion address generator 1600. The address selector 1700 selectively outputs the first refresh address Add_cnt or the second refresh address Add_ins in response to a control signal Ctrl. Although FIG. 1 illustrates an example in which the address selector 1700 receives only an address for the refresh operation, and an external address (not shown) for a normal operation including read and write operations of the semiconductor memory device 1000 may be further provided to the address selector 1700. In the normal operation, the address selector 1700 may receive the external address and then output it to the row decoder 1120 and the column decoder 1130.

The command decoder 1200 decodes an external command from an external source, thereby generating an internal command. When the external command from the external source is a refresh command CMD, the command decoder 1200 generates an internal refresh command Int_CMD by decoding the external command, and then provides the internal refresh command Int_CMD to the refresh control circuit 1300. The refresh control circuit 1300 receives the internal refresh command Int_CMD, and in response to this command, the refresh control circuit 1300 generates a refresh control signal C_Ref. For example, in order to refresh all memory cells included in the cell array 1110, a plurality of refresh commands CMD may be provided from an external source during the refresh period, and the internal refresh command Int_CMD and the refresh control signal C_Ref may be generated to correspond to each of the refresh commands CMD. Alternatively, in a self-refresh mode, in response to an external command indicating a self-refresh entering mode, a clock signal may be periodically generated by an oscillator (not shown) in the semiconductor memory device 1000, and in response to the clock signal, the refresh control signal C_Ref may be generated by the refresh control circuit 1300.

The address counter 1400 performs a counting operation in response to the refresh control signal C_Ref, and outputs a result of the counting operation as the first refresh address Add_cnt. The first refresh address Add_cnt has information related to an address for driving a row so as to perform the refresh operation on the cell array 1110. A unit of the cell regions of the cell array 1110 may be the page unit selected by a row address. In response to a first refresh address Add_cnt, a page may be selected, and then, a refresh operation may be performed on memory cells included in the selected page.

The timing detector 1500 detects a time to perform an insertion refresh operation while the refresh operation (hereinafter, referred to as 'normal refresh operation') is performed on memory cells designated by the address counter 1400 during a refresh period, and generates a detection result. For example, after the normal refresh operation is performed on A cell regions of the cell array 1110, one or more cell regions from among the A cell regions are designated, and then, the insertion refresh operation may be performed thereon. In order to detect the timing, the refresh control signal C_Ref may be provided from the refresh control circuit 1300 to the timing detector 1500. Whenever a refresh control signal C_Ref is counted, the timing detector 1500 may generate a detection signal indicating timing to perform the insertion refresh operation and may output the detection signal to the address counter 1400 and the insertion address generator 1600. Although FIG. 1 illustrates the example in which the detection signal that is provided to the address counter 1400 and the insertion address generator 1600 is separate from the control signal Ctrl, the detection signal and the control signal Ctrl may be the same signal.

The insertion address generator 1600 stores address information about the one or more cell regions on which the insertion refresh operation is to be performed during the refresh period. In response to the detection signal from the timing detector 1500, the insertion address generator 1600 outputs the stored address information as the second refresh address Add_ins. The address selector 1700 selectively outputs the first refresh address Add_cnt when the normal refresh operation is performed, and selectively outputs the second refresh address Add_ins in response to the control signal Ctrl at the time when the insertion refresh operation is performed. The first refresh address Add_cnt or the second refresh address Add_ins, which is selectively output, is provided to the row decoder 1120, and thus, a cell region of the cell array 1110 is selected, so that memory cells of the cell region are refreshed.

According to a test result with respect to a data retention characteristic of the cell regions of the cell array 1110, the insertion address generator 1600 stores address information about cell regions on which the insertion refresh operation is to be performed. For example, address information about one or more cell regions having a relatively inferior data retention characteristic may be stored in the insertion address generator 1600, and thus, the one or more cell regions corresponding to the address information stored in the insertion address generator 1600 may be refreshed at least twice during the refresh period. A cell region having a weak cell is refreshed at least twice during the refresh period operation, so that it is possible to prevent data loss in the weak cell.

The insertion address generator 1600 may store the address information about one or more cell regions in a non-volatile manner. For example, the insertion address generator 1600 may include a storage device such as a register, a fuse, an antifuse, or the like as a device that stores information, and may include a means that stores information in a non-volatile manner via a metal line. For example, the insertion address generator 1600 may include an array including a fuse or an antifuse, and may be embodied as an address table in which the detection signal from the timing detector 1500 is used as an address for an access, and a second refresh address Add_ins stored in the address is selectively output.

When the insertion address generator 1600 is embodied as the metal line or a laser fuse that stores information when a fuse is cut by a laser, the address information about one or more cell regions on which the insertion refresh operation is to be performed may be set as a fixed value. When the insertion address generator 1600 is embodied as a register set including a plurality of registers or is embodied as an electric fuse that stores information according to an electrical signal (or a voltage signal), the address information about one or more cell regions on which the insertion refresh operation is to be performed may be randomly set by a user.

Although FIG. 1 illustrates the example in which the timing detector 1500 and the insertion address generator 1600 are separated functional blocks, aspects of the inventive concept are not limited thereto. For example, the timing detector 1500 and the insertion address generator 1600 may be embodied as the same functional block, and the second refresh address Add_ins may be output to the address selector 1700 during the insertion refresh operation based on a result of the counting operation using the refresh control signal C_Ref.

A plurality of refresh operations is performed in a refresh period at predetermined regular intervals (e.g., refresh intervals). When the cell array 1110 includes N cell regions, and the number of insertion refresh target cell regions is A, according to the present embodiment, N+A refresh operations may be performed during the refresh period. During the refresh period, after a first refresh operation is performed on a predetermined number (e.g., N/A) of cell regions, a second refresh operation on one cell region may be performed. In the present embodiment, because the refresh period includes the first refresh operation with respect to the N cell regions and the second refresh operation with respect to the A cell regions, the refresh period may be controlled according to the number (i.e., A) of the insertion refresh target cell regions.

In the present embodiment, according to a data retention characteristic of a memory cell, a refresh period of a cell, region having a weak cell may be shortly set, and an increase of a refresh period of a normal cell region may be minimized, so that it is possible to reduce a data retention load of the normal cell region. In order to reduce an increase of a current IDD6 required to perform a refresh operation, it is necessary to set a refresh interval to be equal or similar to that of the prior art. In this regard, according to the present embodiment, the refresh period of the weak cell is reduced without decreasing the refresh interval, so that the data retention characteristic may be improved.

FIGS. 2A and 2B illustrate examples in which a refresh operation is performed during a refresh period, according to embodiments of the inventive concept.

In FIGS. 2A and 2B, the horizontal axes indicate time and the numbers above each vertical arrow indicate addresses of cell regions included in the cell array 1110. In the examples of FIGS. 2A and 2B, the cell array 1110 has 16 k cell regions (or 16 k pages) and a refresh interval therebetween is 7.8 µs. A time obtained by summing a time of 64 ms taken to refresh all of the 16 k cell regions and a time (e.g., α or β) taken to perform an insertion refresh operation on some cell regions of the 16 k cell regions corresponds to a refresh period tREF according to the present embodiment. The cell arrays may be divided into two regions (blocks), when a refresh operation is performed by simultaneously refreshing pages of each block (when 2 pages of the cell array are refreshed every refresh interval), all pages may be refreshed during the refresh period tREF (64 ms) by performing the refresh operation according to the refresh interval tRFEI (7.8 us). Hereinafter, operations of the semiconductor memory device 1000 will be described with reference to FIGS. 1, 2A, and 2B.

As illustrated in FIG. 2A, when the refresh period tREF starts, a normal refresh operation is performed on a predetermined number of cell regions. For example, 4 cell regions are designated by four first refresh addresses Add_cnt and then normal refresh operations are performed. Afterward, a cell region is designated by a second refresh address Add_ins, and then, an insertion refresh operation is performed on the cell region. As described above, addresses of cell regions having a relatively inferior data retention characteristic from among the cell regions of the cell array 1110 may be stored, and one of the stored addresses may be output as the second refresh address Add_ins.

In other words, whenever the 4 normal refresh operations are completed, a insertion refresh operation is performed. Thus, in a case where a time required to perform a normal refresh operation on all of the cell regions of the cell array 1110 is 64 ms, a time required to perform an insertion refresh operation according to an insertion address is 16 ms. Thus, in the embodiment of the FIG. 2A, the refresh period tREF may be 80 ms.

When the cell array 1110 includes the 16 k cell regions, an insertion refresh operation may be performed 4 k times during the refresh period tREF. In this case, 4 k cell regions from among the 16 k cell regions may be stored in the insertion address generator 1600. Alternatively, some of the 16 k cell regions may be refreshed at least three times during the refresh period tREF, and in this case, address information about cell regions that are less than 4 k may be stored in the insertion address generator 1600. In other words, during the refresh period tREF, a refresh operation is performed once on cell regions of the 16 k cell regions which have a relatively superior data retention characteristic, whereas a refresh operation is performed at least twice on cell regions of the 16 k cell regions which have a relatively inferior data retention characteristic, so that the refresh operation is performed on the cell regions, i.e., insertion refresh target cell regions, during a period shorter than the refresh period tREF.

FIG. 2B illustrates the embodiment in which, after 8 cell regions are designated by 8 first refresh addresses Add_cnt and then a normal refresh operation is performed on the 8 cell regions, one cell region is designated by one second refresh address Add_ins and then an insertion refresh operation is performed on the one cell region. In other words, whenever the 8 normal refresh operations are completed, the insertion refresh operation is performed. In this regard, a time required to perform the insertion refresh operation is 8 ms. Thus, in the embodiment of FIG. 2B, a refresh period tREF may be 72 ms.

In the embodiments of FIGS. 2A and 2B, the insertion refresh operation is performed once after the normal refresh operation is performed 4 times, and the insertion refresh operation is performed once after the normal refresh operation is performed 8 times, but aspects of the inventive concept are not limited thereto. In another embodiment, the insertion refresh operation may be performed once after the normal refresh operation is performed twice or 16 times. As the insertion refresh operation is frequently performed, the refresh period tREF increases. As the insertion refresh operation is less performed, the refresh period tREF decreases.

Figure 3:
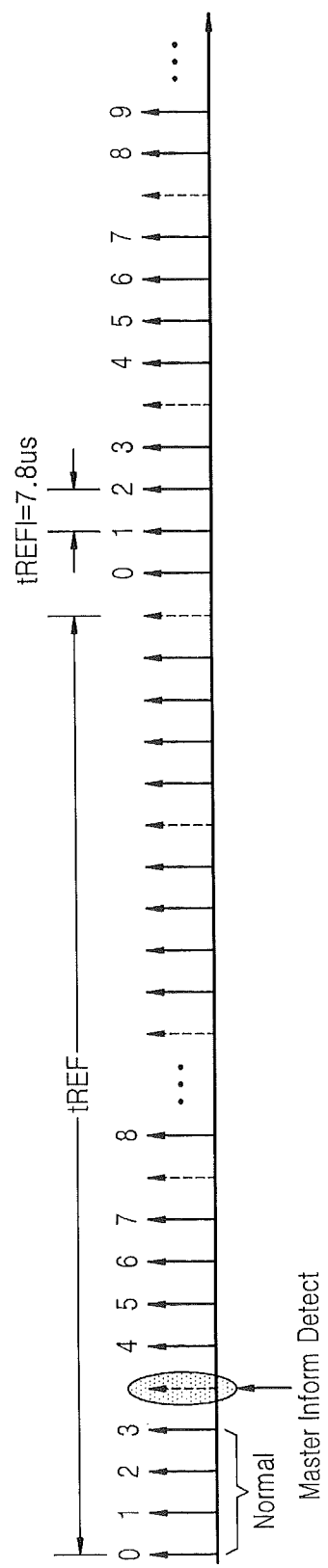
FIG. 3 illustrates another example in which a refresh operation is performed during one refresh period, according to another embodiment of the inventive concept.

FIG. 3 illustrates another example in which a refresh operation is performed during a refresh period, according to another embodiment of the inventive concept. In the embodiment of FIG. 3, after a normal refresh operation is performed on a predetermined number (e.g., 4) of cell regions, whether to perform an insertion refresh operation is determined, and according to a determination result, the insertion refresh operation is performed.

Master information indicating whether to perform the insertion refresh operation may be additionally stored in the insertion address generator 1600. For example, when the master information is in a first state, the master information may indicate that the insertion refresh operation is performed, and when the master information is in a second state, the master information may indicate that the insertion refresh operation is skipped. The insertion address generator 1600 may store the master information and second refresh addresses Add_ins as a table. The second refresh address Add_ins of an insertion refresh target when the master information is in the first state may be stored, or the second refresh address Add_ins of the insertion refresh target when the master information is in the second state may not be stored. The master information may be provided to a control circuit (not shown) to control whether to enable a refresh operation of the semiconductor memory device 1000, and according to the first and second states of the master information, the insertion refresh operation may be enabled or disabled.

As illustrated in FIG. 3, after the 4 cell regions are designated by 4 first refresh addresses Add_cnt and then normal refresh operations are performed, the master information is determined so that whether to perform the insertion refresh operation is determined. When the master information is in the first state, a cell region is designated by a second refresh address Add_ins and then an insertion refresh operation is performed on the cell region. When the master information is in the second state, the insertion refresh operation is skipped at corresponding insertion refresh timing.

According to the embodiment of FIG. 3, the number of refresh operations that are actually performed during a refresh period tREF may vary. For example, according to states of the master information, the insertion refresh operation may be performed 4 k times during a refresh period tREF or the insertion refresh operation may be performed 4 k times or less during a refresh period tREF. In a case where the insertion refresh operation is performed at regular intervals but the insertion refresh operation with respect to all cell regions having weak cells may be performed at some of a plurality of pieces of insertion refresh timing, the insertion refresh operation is not actually performed at the rest of the plurality of pieces of insertion refresh timing.

FIG. 4 illustrates a table indicating values of a refresh period according to a ratio of a normal refresh operation to an insertion refresh operation. In a case of a cell region having a weak cell, a refresh operation is performed at least twice in a refresh period tREF, and thus, the refresh period of FIG. 4 actually corresponds to a refresh period of a normal cell region (i.e., a good cell region).

When the cell array 1110 has 16 k cell regions (or 16 k pages), and a refresh interval therebetween is 7.8 us, 64 ms is required to perform the normal refresh operation on the 16 k cell regions. In addition, when the insertion refresh operation is performed according to the one or more embodiments, a value of the one refresh period tREF may be adjusted to be equal to or greater than 64 ms but to be less than 128 ms.

For example, in a case where the insertion refresh operation is performed once whenever the normal refresh operation is performed twice, a time required to perform the insertion refresh operation during the refresh period tREF is 32 ms, so that the refresh period tREF is 96 ms. Similarly, in a case where the insertion refresh operation is performed once whenever the normal refresh operation is performed 4 times, the refresh period tREF is 80 ms, and in a case where the insertion refresh operation is performed once whenever the normal refresh operation is performed 8 times, the refresh period tREF is 72 ms. In a case where the insertion refresh operation is performed once whenever the normal refresh operation is performed 16 times, the refresh period tREF is 68 ms. As the normal refresh operation is frequently performed, the refresh period tREF has a relatively large value. As the normal refresh operation is less performed, the refresh period tREF has a relatively small value.

Figure 5A:
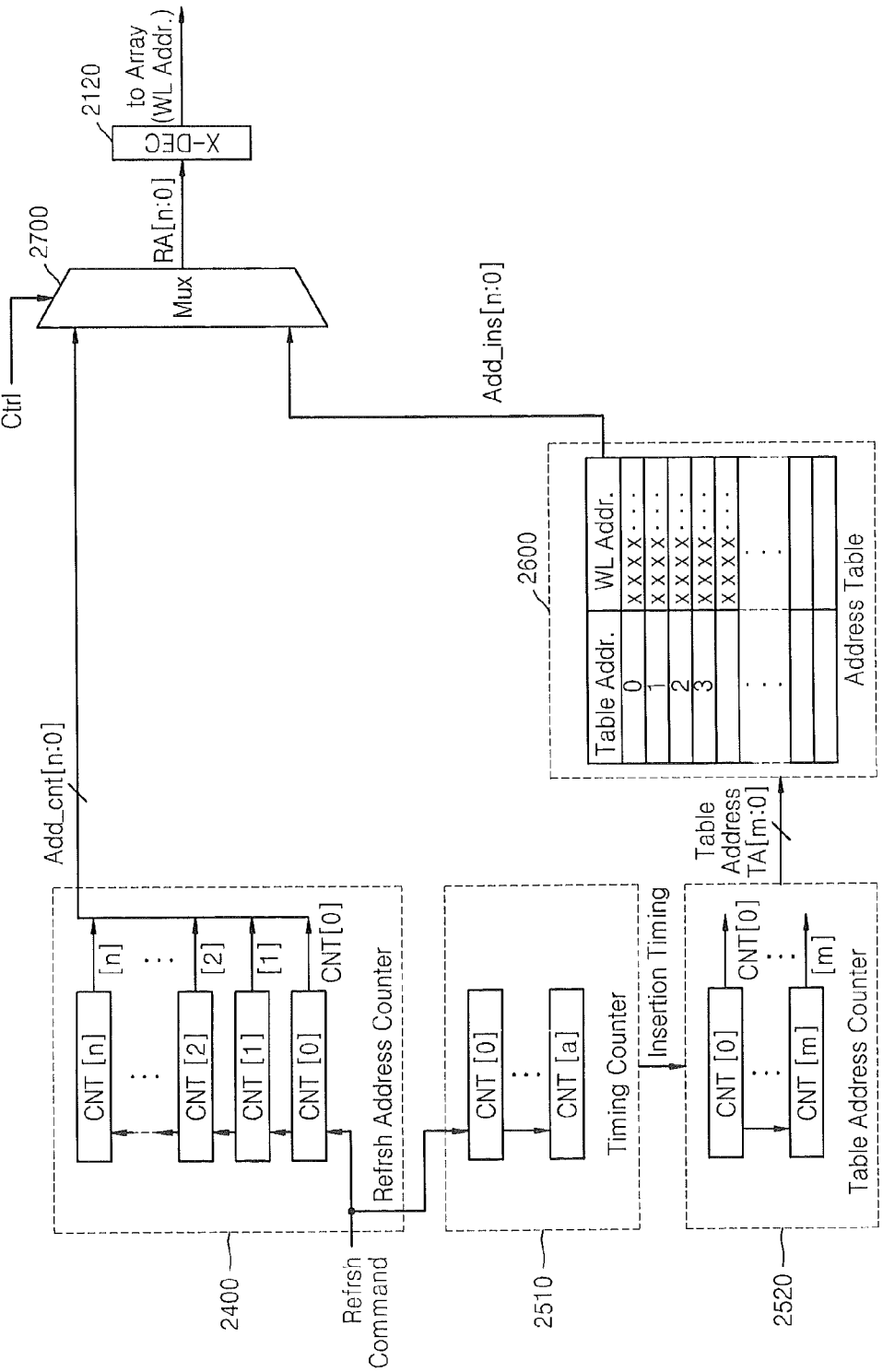
FIGS. 5A through 5D are block diagrams of a timing detector and an insertion address generator of FIG. 1, according to embodiments of the inventive concept.

FIGS. 5A through 5D are block diagrams of the timing detector 1500 and the insertion address generator 1600 of FIG. 1, according to embodiments of the inventive concept. As illustrated in FIG. 5A, a semiconductor memory device 2000 may include an address counter 2400, an insertion address generator 2600, an address selector 2700, and a row decoder 2120. The semiconductor memory device 2000 may include one or more counters (i.e., first and second counters 2510 and 2520) as the timing detector 1500 of FIG. 1. The address counter 2400 performs a counting operation in response to an external refresh command, thereby generating a first refresh address Add_cnt[n:0]. In the embodiments of FIGS. 5A through 5D, the address counter 2400 responds to the external refresh command, but as in the aforementioned embodiments, the address counter 2400 may count an internal clock signal (not shown) of the semiconductor memory device 2000 in a self-refresh mode.

The first counter 2510 is a counter to output a detection signal that indicates timing to perform an insertion refresh operation. The first counter 2510 may perform a counting operation in response to an external refresh command. For example, the first counter 2510 outputs a detection signal indicating insertion timing to the second counter 2520, in response to a+1 times of a refresh command. If an insertion refresh operation is performed once after a normal refresh operation is performed 4 times, the first counter 2510 performs the counting operation 4 times, and then, in a next counting operation (e.g., a fifth counting operation), the first counter 2510 outputs a detection signal to inform that it is timing to perform the insertion refresh operation in a current refresh operation.

The second counter 2520 generates a table address TA[m:0] based on a counting operation. The second counter 2520 counts the detection signal output from the first counter 2510 and then outputs a counting result as the table address TA[m:0]. The table address TA[m:0] is provided to the insertion address generator 2600. The table address TA[m:0] may be used as an address to access information stored in the insertion address generator 2600. Address information (e.g., a second refresh address Add_ins[n:0]) of an insertion refresh target cell region is stored in a region that is designated by a bit value of the table address TA[m:0], and as the bit value of the table address TA[m:0] increases, second refresh addresses Add_ins[n:0] stored in the insertion address generator 2600 are sequentially provided to the address selector 2700.

The address selector 2700 receives the first refresh address Add_cnt[n:0] and the second refresh address Add_ins[n:0], and outputs the first refresh address Add_cnt[n:0] or the second refresh address Add_ins[n:0] as a row address RA[n:0] to the row decoder 2120, in response to a control signal Ctrl. The control signal Ctrl may be provided from the timing detector 1500 of FIG. 1. For example, in the embodiment of FIG. 5A, the detection signal from the first counter 2510 may be provided as the control signal Ctrl to the address selector 2700. Accordingly, in a normal refresh operation, at least two cell regions may be selected by the first refresh address Add_cnt[n:0] and then may be refreshed, and during an insertion refresh operation, a cell region may be selected by the second refresh address Add_ins[n:0] and then may be refreshed.

As described above, the insertion address generator 2600 is a means for storing information and may be embodied as a register or a fuse (or an antifuse). According to how the insertion address generator 2600 is embodied, operations thereof may be changed. For example, when the insertion address generator 2600 is embodied as a fuse array, a time required to read address information and to provide the address information to the address selector 2700 in real-time may not be assured during the insertion refresh operation.

Figure 5B:
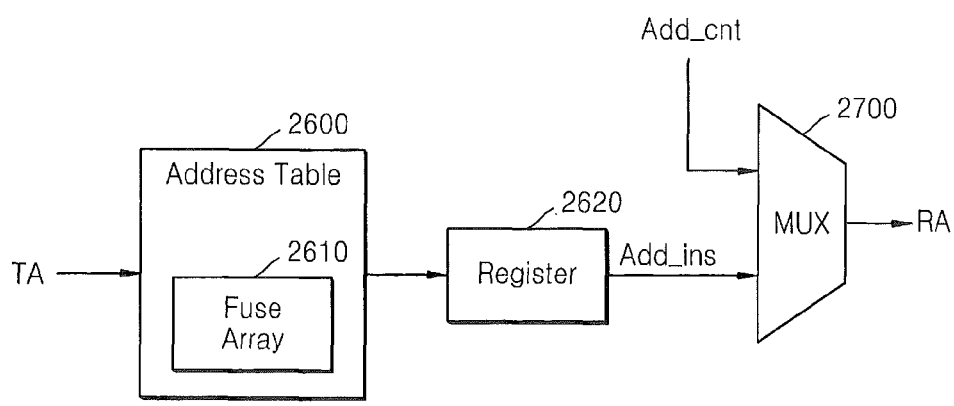

FIG. 5B illustrates an example in which the insertion address generator 2600 is embodied as a fuse array 2610, where a register 2620 may be disposed between the insertion address generator 2600 and the address selector 2700. The register 2620 may store a portion of information stored in the fuse array 2610.

Figure 5C:
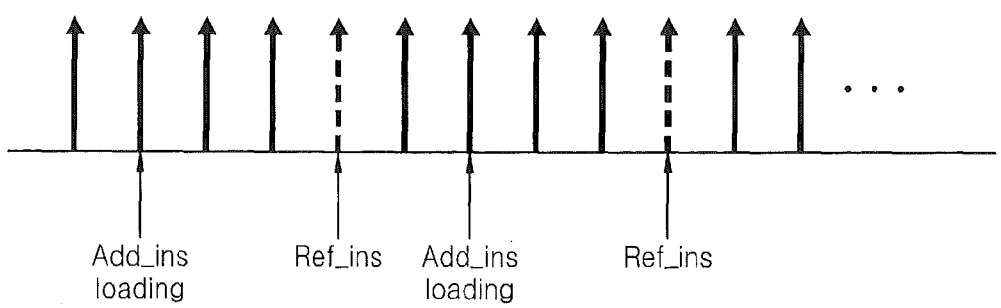

A table address TA may be provided to the address generator 2600 during a normal refresh timing before an insertion refresh operation is actually performed. By doing so, a read second refresh address Add_ins is provided to the register 2620. For example, as illustrated in FIG. 5C, the table address TA is generated in response to a second normal refresh timing, and the second refresh address Add_ins that is read in response to the table address TA is loaded to the register 2620. In insertion refresh timing, the second refresh address Add_ins stored in the register 2620 is provided to the address selector 2700, so that the insertion refresh operation is performed.

Although the present embodiment is realized in the aforementioned way, an actual counting operation may be performed in the same way as the aforementioned embodiments. When an insertion refresh operation is performed once after a normal refresh operation is performed 4 times, the table address TA may be generated in a fifth counting operation after four counting operations. However, it is required to assure timing for generation of the table address TA during the normal refresh operation.

Figure 5D:
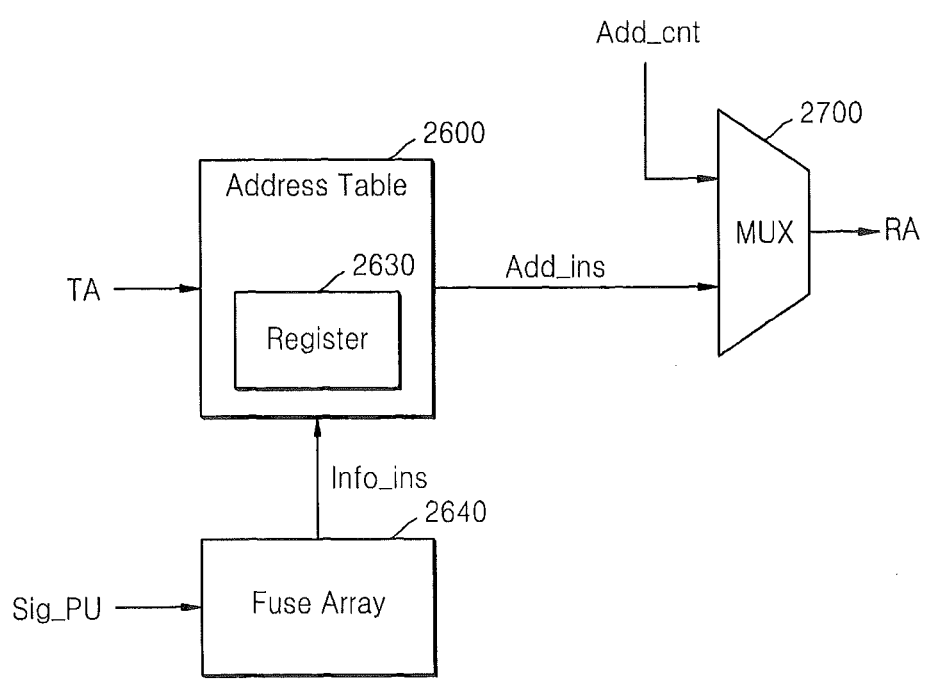

FIG. 5D illustrates another embodiment of the embodiment of FIG. 5B, where a fuse array 2640 that is separate from the address generator 2600 is arranged. The address generator 2600 may further include a register 2630. Information Info_ins related to an initial second refresh address Add_ins is stored in the fuse array 2640, and the information Info_ins stored in the fuse array 2640 is loaded to the register 2630 in response to a control signal (e.g., a power apply signal Sig_PU) at a predetermined time (e.g., when a power is applied thereto). The register 2630 and the fuse array 2640 may have a storage means to store a plurality of pieces of information that actually have the same size.

In the embodiment of FIG. 5D, when an insertion refresh operation is actually performed, a table address TA may be provided to the address generator 2600, and a second refresh address Add_ins read from the register 2630 may be provided to the address selector 2700. In the embodiment of FIG. 5D, information that is stored in the fuse array 2640 during an initial operation of a semiconductor memory device may be loaded to the register 2630 of the address generator 2600. However, in the embodiment of FIG. 5D, it is also possible that an additional register (not shown) is further arranged, and a second refresh address Add_ins is read from the register 2630 before an insertion refresh operation is actually performed.

Figure 6:
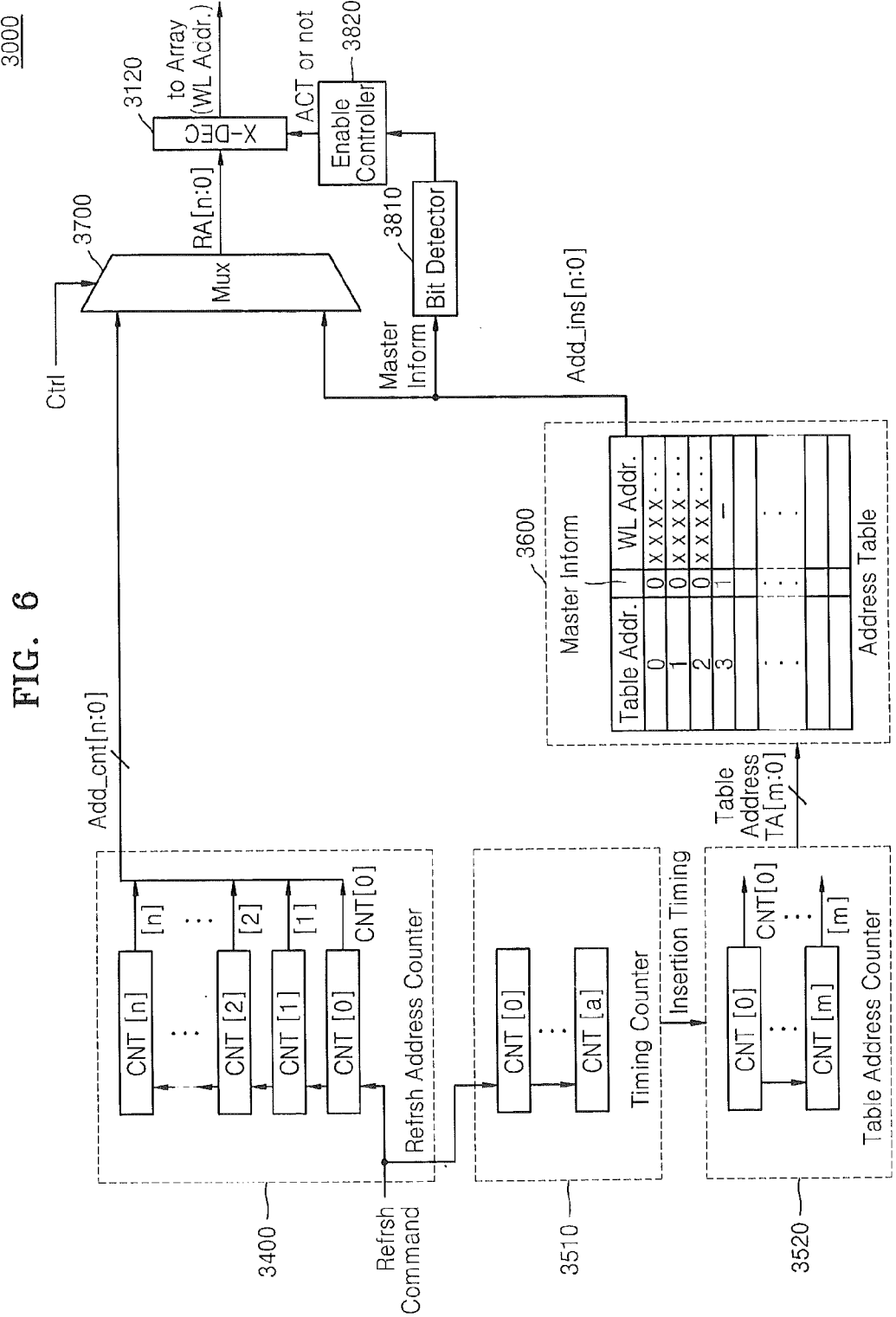
FIG. 6 is a block diagram of the timing detector and the insertion address generator of FIG. 1, according to another embodiment of the inventive concept.

FIG. 6 is a block diagram of the timing detector 1500 and the insertion address generator 1600 of FIG. 1, according to another embodiment of the inventive concept. As illustrated in FIG. 6, a semiconductor memory device 3000 may include an address counter 3400, an insertion address generator 3600, an address selector 3700, and a row decoder 3120. The semiconductor memory device 3000 may include one or more counters (i.e., first and second counters 3510 and 3520) as the timing detector 1500 of FIG. 1. In addition, the semiconductor memory device 3000 may further include a bit detector 3810 for receiving master information stored in the insertion address generator 3600 and for detecting bit information of the master information, and an enable controller 3820 for controlling whether to enable a refresh operation.

The address selector 3700 receives a first refresh address Add_cnt[n:0] from the address counter 3400, and a second refresh address Add_ins[n:0] from the insertion address generator 3600. The master information output from the insertion address generator 3600 is provided to the bit detector 3810. The master information may be at one of a first state and a second state. When the master information is at the first state, the master information indicates that an insertion refresh operation is performed, and when the master information is in the second state, the master information indicates that the insertion refresh operation is skipped.

The enable controller 3820 controls whether to enable one or more circuit blocks arranged in the semiconductor memory device 3000, thereby preventing a refresh operation from being performed. In the embodiment of FIG. 6, the enable controller 3820 controls the row decoder 3120 to disable wordline selection by the row decoder 3120, so that the refresh operation is skipped. When the master information is in the first state, the second refresh address Add_ins [n:0] is provided to the row decoder 3120 via the address selector 3700 so that an insertion refresh operation is performed on a corresponding cell region. When the master information is in the second state, selection of the cell region is prevented in response to a control by the enable controller 3820, so that the insertion refresh operation is skipped. When the master information is in the second state in an address table of the insertion address generator 3600, the second refresh address Add_ins[n:0] corresponding thereto may not be stored. Alternatively, because the insertion refresh operation may be skipped when a wordline is driven, when the master information is in the second state, the second refresh address Add_ins[n:0] corresponding thereto may be stored or the second refresh address Add_ins[n:0] may be stored as a default value.

Figure 7:
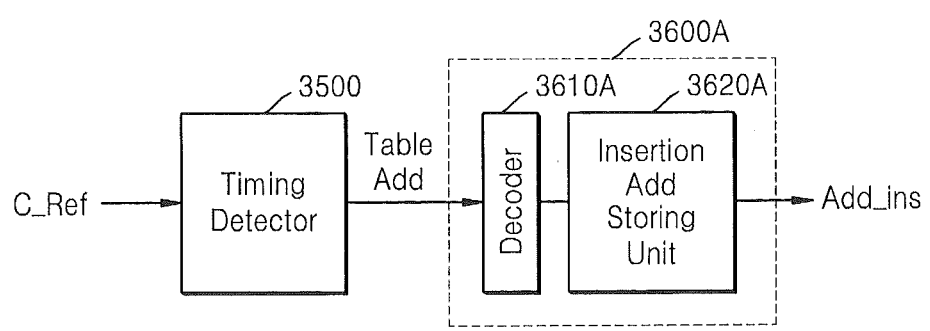
FIG. 7 is a block diagram of an insertion address generator of FIG. 1, according to another embodiment of the inventive concept.

FIG. 7 is a block diagram of the insertion address generator 1600 of FIG. 1, according to another embodiment of the inventive concept. In the embodiment of FIG. 7, an insertion address generator 3600A does not store all of a table address TA[m:0] and a second refresh address Add_ins [n:0], but instead, the insertion address generator 3600A has a decoding function, and thus, stores only the second refresh address Add_ins[n:0].

As illustrated in FIG. 7, a refresh control signal C_Ref is provided to a timing detector 3500. The timing detector 3500 detects a time to perform an insertion refresh operation by counting the refresh control signal C_Ref, generates a table address Table Add according to a detection result, and then provides the table address Table Add to the insertion address generator 3600A. The insertion address generator 3600A may include a decoder 3610A and an insertion address storing unit 3620A.

The decoder 3610A receives the table address Table Add, decodes the table address Table Add, and then outputs an access signal to access the insertion address storing unit 3620A. The insertion address storing unit 3620A includes a plurality of storage regions that are designated by the table address Table Add. For example, the insertion address storing unit 3620A stores second refresh addresses Add_ins of insertion refresh target cell regions. In an embodiment where master information is used, the insertion address storing unit 3620A may further store the master information in addition to the second refresh addresses Add_ins. When master information of a cell region accessed by the table address Table Add is in a second state, an insertion, refresh operation is skipped, and when the master information of the accessed cell region is at a first state, the insertion refresh operation is performed on the accessed cell region by the second refresh address Add_ins that is accessed together.

Figure 8:
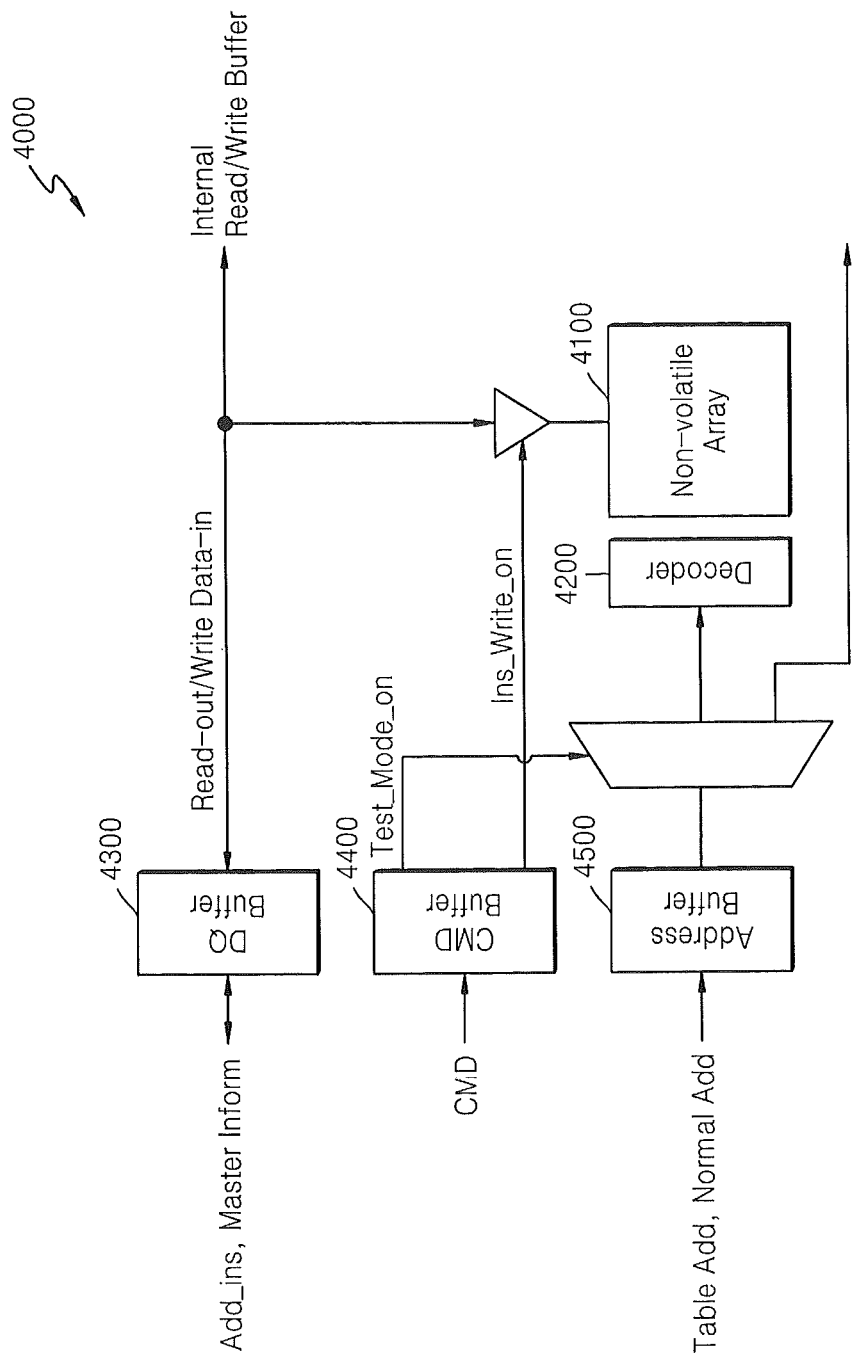
FIG. 8 is a block diagram illustrating an example in which address information is stored in an insertion address generator, according to an embodiment of the inventive concept.

FIG. 8 is a block diagram illustrating an example in which address information is stored in an insertion address generator, according to an embodiment of the inventive concept. When a cell array is tested using test equipment, a refresh characteristic of each of cell regions may be tested, and according to test results, one or more pieces of address information of one or more insertion refresh target cell regions may be stored in the insertion address generator. In FIG. 8, the insertion address generator includes a non-volatile array 4100, and it is assumed that the one or more pieces of address information are stored in the non-volatile array 4100.

As illustrated in FIG. 8, a semiconductor memory device 4000 may include the non-volatile array 4100, a decoder 4200, a data buffer 4300, a command buffer 4400, and an address buffer 4500. Although the command buffer 4400 and the address buffer 4500 are separated in the embodiment of FIG. 8, they may be formed as the same buffer.

The test equipment may provide a command, an address, data, and the like to perform a test to the semiconductor memory device 4000 via the data buffer 4300, the command buffer 4400, and the address buffer 4500, and output data may be provided to the test equipment so that the refresh characteristic of the cell array may be determined. According to a determination result with respect to the refresh characteristic, the test equipment stores address information (e.g., a second refresh address Add_ins and master information) of an insertion refresh target in the non-volatile array 4100.

A plurality of pieces of information to be stored in the non-volatile array 4100 may be provided to the non-volatile array 4100 via the data buffer 4300. In response to a command CMD for an information recording operation, a control signal Ins_Write_On to write information is activated, so that a path in which the second refresh address Add_ins and the master information are provided to the non-volatile array 4100 is activated. In response to a control signal Test_Mode_On indicating a start of a test mode, a table address Table Add is provided to the decoder 4200 via a multiplexer (or a demultiplexer). The second refresh address Add_ins and the master information are stored in a region of the non-volatile array 4100 which is selected by the table address Table Add. After the test mode is ended, when the semiconductor memory device performs a normal operation, a normal address Normal Add is received from an external source and then is provided to a row decoder (not shown) and/or a column decoder (not shown) via the multiplexer (or the demultiplexer), and a signal transfer path between the data buffer 4300 and the non-volatile array 4100 is blocked.

Figure 9:
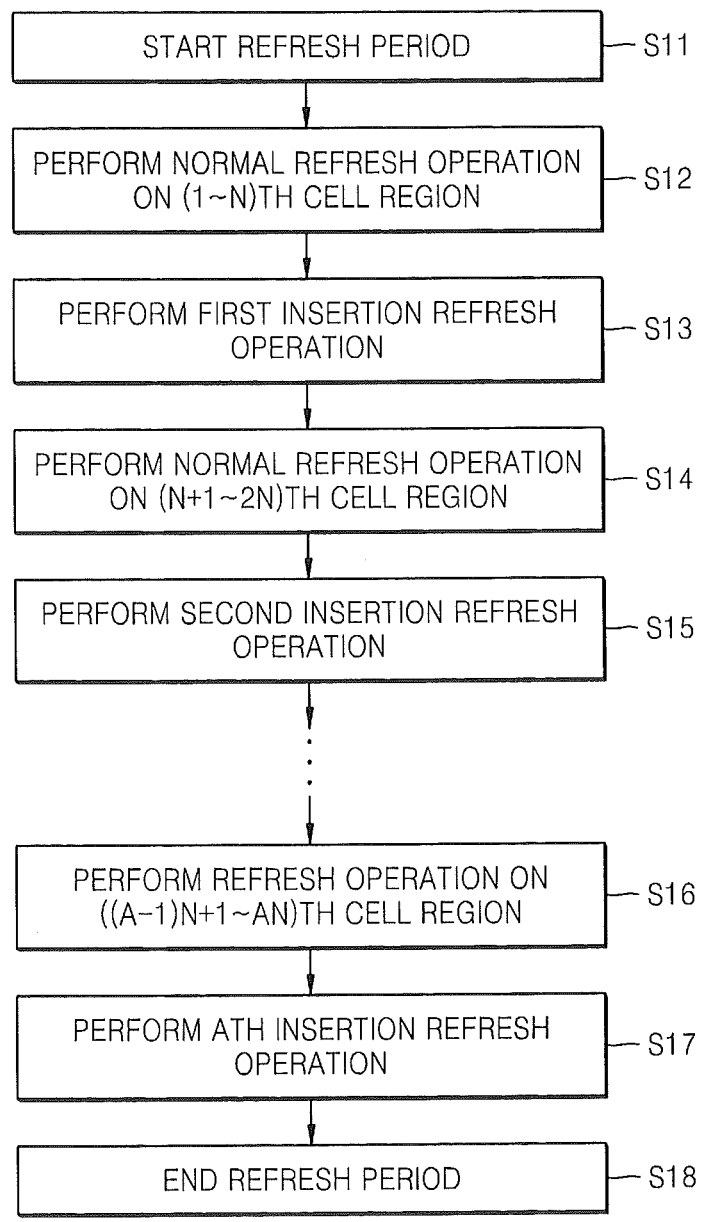
FIG. 9 is a flowchart indicating a refresh operation of a semiconductor memory device, according to an embodiment of the inventive concept.

FIG. 9 is a flowchart indicating a refresh operation of a semiconductor memory device, according to an embodiment of the inventive concept. In the embodiment of FIG. 9, it is assumed that a cell array of the semiconductor memory device includes A×N cell regions.

As illustrated in FIG. 9, a refresh period starts in response to an external command (operation S11). A refresh control signal is generated in response to the external command or an internal clock signal, and a counting operation is performed in response to the refresh control signal, so that a first refresh address for a normal refresh operation is generated. By doing so, the normal refresh operation is performed on N cell regions (a first cell region through an N$^{th}$ cell region) (operation S12).

After the normal refresh operation is performed on the N cell regions, insertion refresh timing is determined, so that a first insertion refresh operation is performed (operation S13). As in the aforementioned embodiment, the first insertion refresh operation may be performed by accessing the address information stored in the semiconductor memory device, and the first insertion refresh operation may be performed on one or more specific cell regions.

Afterward, a normal refresh operation is performed on next N cell regions (an N+1$^{th}$ cell region through a 2N$^{th}$ cell region) (operation S14). After the normal refresh operation is performed on the next N cell regions, insertion refresh timing is detected, so that a second insertion refresh operation is performed (operation S15). The normal refresh operation on the N cell regions and the insertion refresh operation on at least one cell region are repeatedly performed.

After a normal refresh operation is performed on last N cell regions (A (A−1)N+1$^{th}$ cell region through a A*N$^{th}$ cell region) (operation S15), an A$^{th}$ insertion refresh operation is performed (operation S17). As described above, when the normal refresh operation is performed on all cell regions of a cell array, and the insertion refresh operation is performed on insertion refresh target cell regions, the refresh period is ended (operation S18).

According to the present embodiment, when the normal refresh operation with respect to a cell group including a plurality of cell regions is completed, the insertion refresh operation is performed. In a case where a cell array includes A cell groups, the insertion refresh operation may be performed A times during a refresh period. In this case, a refresh operation is performed on some cell regions of the cell array during the refresh period, whereas the refresh operation is performed twice on other cell regions of the cell array during the refresh period. The refresh period may be controlled so that the number of insertion refresh operations to be performed in the refresh period is varied while a refresh interval of refresh operations is constantly maintained. By performing the refresh operation at least twice on cell regions having an inferior data retention characteristic during the refresh period, the cell regions may be actually refreshed at shorter refresh period.

Figure 10:
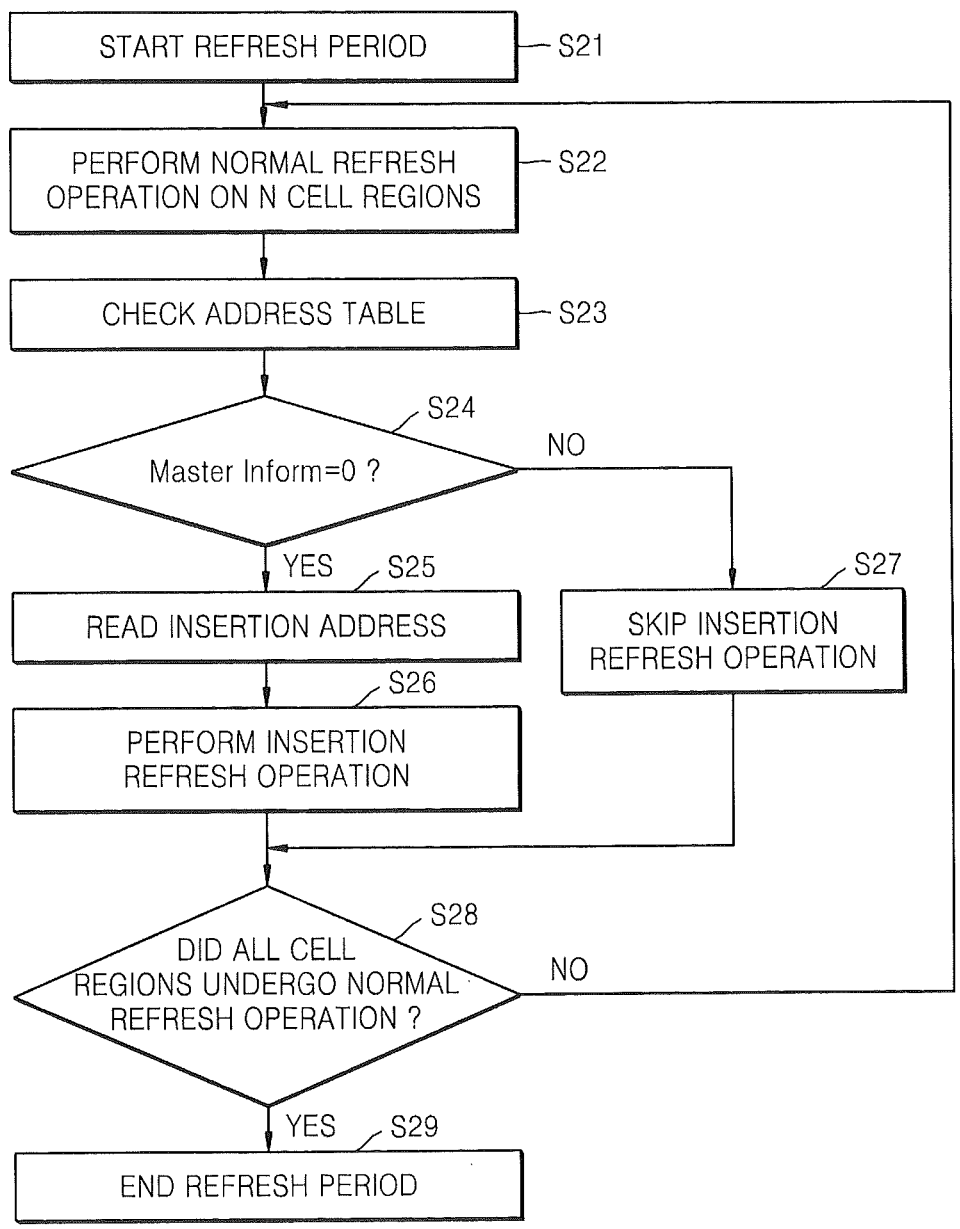
FIG. 10 is a flowchart indicating a refresh operation of a semiconductor memory device, according to another embodiment of the inventive concept.

FIG. 10 is a flowchart indicating a refresh operation of a semiconductor memory device, according to another embodiment of the inventive concept.

As illustrated in FIG. 10, a refresh period starts in response to an external command (operation S21), and a normal refresh operation is performed on N cell regions (operation S22). After the normal refresh operation is performed on the N cell regions, insertion refresh timing is determined, an address table is checked at the insertion refresh timing (operation S23), and a status of master information stored in the address table is determined (operation S24).

When the status of the master information indicates a first state (e.g., a value of "0"), an insertion refresh operation is performed, and for this operation, an insertion address (e.g., a second refresh address) is read (operation S25). The insertion refresh operation is performed on a cell region that corresponds to the read insertion address (operation S26). When the status of the master information indicates a second state (e.g., a value of "1"), the insertion refresh operation is skipped (operation S27).

After the insertion refresh operation is performed or skipped at the insertion refresh timing, it is determined whether the normal refresh operation is performed on all cell regions (operation S28), and if the normal refresh operation is not completed, the normal refresh operation with respect to next N cell regions is performed and the insertion refresh operation is performed or skipped as shown in operations S22 through S27. When the normal refresh operation is performed on all cell regions, the refresh period is ended (operation S29).

In the embodiment of FIG. 10, the address table is checked after the normal refresh operation is performed on the N cell regions. However, aspects of the inventive concept are not limited thereto. For example, as illustrated in the embodiments of FIGS. 5B, 5C, and 5D, the address table may be checked and the insertion address may be read in the normal refresh operation, and the read insertion address may be loaded to a predetermined register. The loaded insertion address is provided to a cell region at actual insertion address timing, so that the insertion refresh operation is performed on the cell region.

Figure 11:
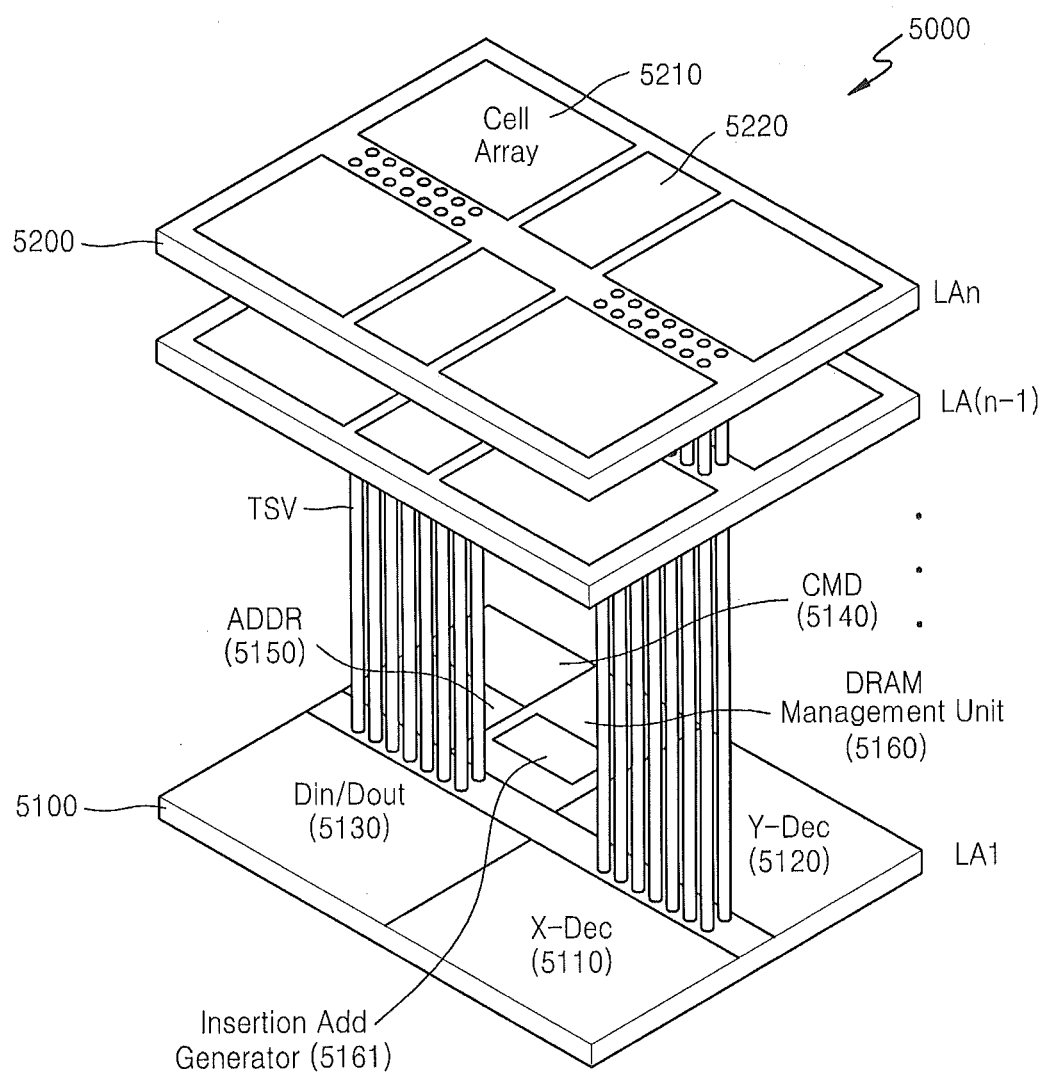
FIG. 11 is a diagram illustrating a structure of a semiconductor memory device, according to another embodiment of the inventive concept.

FIG. 11 is a diagram illustrating a structure of a semiconductor memory device 5000, according to another embodiment of the inventive concept. As illustrated in FIG. 11, the semiconductor memory device 5000 may include a plurality of semiconductor layers LA1 through LAn. Each of the semiconductor layers LA1 through LAn may be a memory chip including a DRAM cell. In some embodiments, some of the semiconductor layers LA1 through LAn may be master chips for interfacing with an external controller, and the rest of the semiconductor layers LA1 through LAn may be slave chips for storing data. In the embodiment of FIG. 11, it is assumed that the semiconductor layer LA1 that is positioned at a bottom is the master chip, and the semiconductor layers LA2 through LAn are the slave chips.

The semiconductor layers LA1 through LAn exchange signals via through silicon vias TSV, and the master chip (i.e., the semiconductor layer LA1) communicates with an external memory controller (not shown) by using a conductive means (not shown) formed in an exterior surface of the semiconductor layer LA1. The structure and operations of the semiconductor memory device 5000 will be described with respect to a first semiconductor layer 5100 and an $n^{th}$ semiconductor layer 5200.

The first semiconductor layer 5100 includes various circuits to drive a cell array 5210 in each of the slave chips. For example, the first semiconductor layer 5100 may include a row decoder X-Dec. 5110 for driving a wordline, a column decoder Y-Dec. 5120 for driving a bitline, a data input/output (I/O) unit 5130 for controlling input/output of data, a command buffer 5140 for receiving a command CMD from an external source, an address buffer 5150 for receiving and buffering an address from the external source, or the like.

The first semiconductor layer 5100 may further include a DRAM management unit 5160 for managing memory operations of the slave chips. The DRAM management unit 5160 may manage refresh operations with respect to cell regions of the semiconductor memory device 5000. For example, as in the aforementioned embodiments, the DRAM management unit 5160 may manage a refresh period controlling operation using a normal refresh operation and an insertion refresh operation. For this management, the DRAM management unit 5160 may include an insertion address generator 5161. In the embodiment of FIG. 11, only the insertion address generator 5161 is illustrated, but the DRAM management unit 5160 may further include various circuit blocks related to the refresh operations illustrated in FIGS. 1, 5A through 5D, and 6.

The $n^{th}$ semiconductor layer 5200 may include the cell array 5210, and a peripheral circuit region 5220 in which peripheral circuits including row/column selection units (not shown) to select rows and columns of the cell array 5210, a bitline sense amplifier (not shown), and the like are disposed to drive the cell array 5210.

Figure 12A:
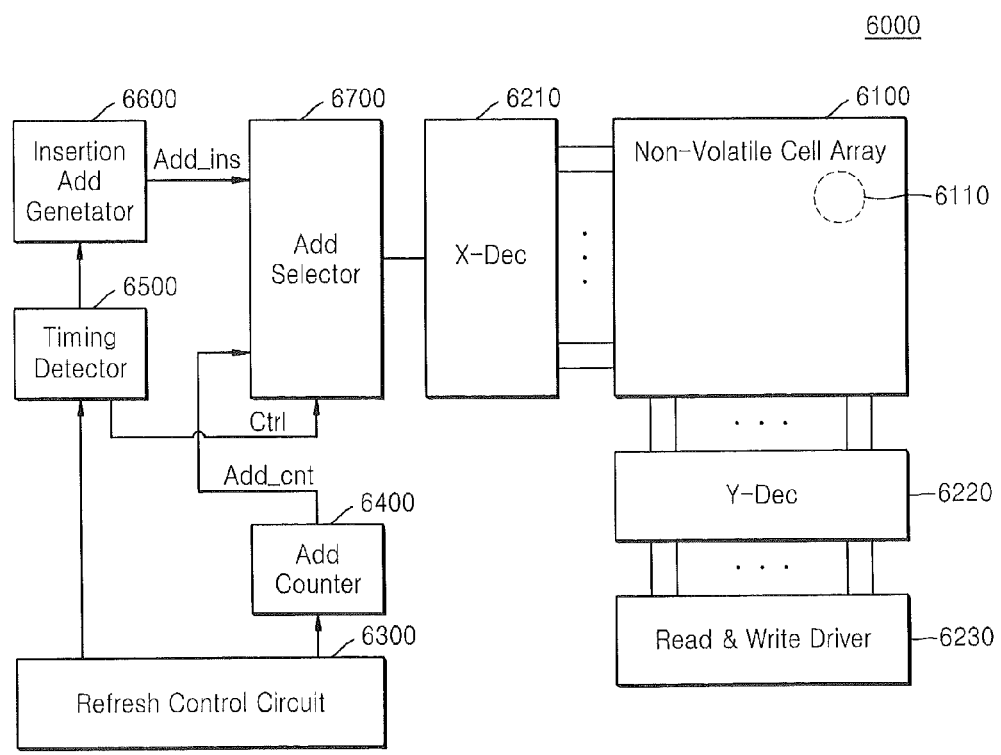
FIGS. 12A and 12B are block diagrams of a semiconductor memory device, according to another embodiment of the inventive concept.
Figure 12B:
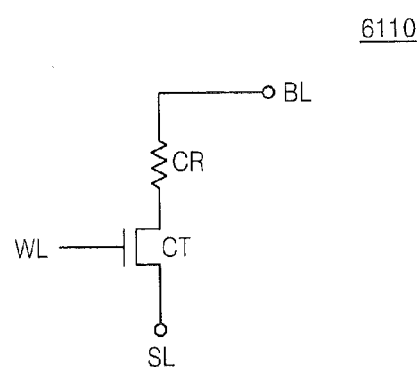

FIGS. 12A and 12B are block diagrams of a semiconductor memory device 6000, according to another embodiment of the inventive concept. In the embodiment of FIGS. 12A and 12B, refresh operations are applied to a non-volatile memory device (i.e., the semiconductor memory device 6000). The non-volatile memory device may include a flash memory, a phase change random access memory (PRAM), a resistive random access memory (RRAM) using a variable resistance characteristic material such as complex metal oxide or the like, a magnetic random access memory (MRAM) using a ferromagnetic material, a ferroelectric random access memory (FRAM) using a ferroelectric capacitor, or the like.

As illustrated in FIG. 12A, the semiconductor memory device 6000 includes a non-volatile cell array 6100. The non-volatile cell array 6100 includes one or more non-volatile cells 6110. The semiconductor memory device 6000 may include a row decoder 6210, a column decoder 6220, and a read & write driver 6230, which are peripheral circuits to drive the non-volatile cell array 6100.

In order to perform a refresh operation according to the embodiments of the inventive concept, the semiconductor memory device 6000 may further include a refresh control circuit 6300, an address counter 6400, a timing detector 6500, an insertion address generator 6600, and an address selector 6700. Even a non-volatile memory may lose stored data due to various factors. For example, in a case of a memory such as an MRAM, a data value (e.g., a resistance value of a magnetic tunnel junction (MTJ)) stored in a memory cell may be changed according to time. Accordingly, operations to re-write data to the one or more non-volatile cells 6110 may be performed at regular time intervals. The re-write operations performed to retain data of the semiconductor memory device 6000 may be defined as the refresh operations.

The refresh control circuit 6300 outputs a refresh control circuit in response to an external command or an internal clock signal, and the address counter 6400 counts the refresh control circuit, thereby generating a first refresh address Add_cnt. The timing detector 6500 detects insertion refresh timing based on an output from the refresh control circuit 6300, and the insertion address generator 6600 generates a second refresh address Add_ins based on the detection result of the insertion refresh timing. The address selector 6700 selectively outputs the first refresh address Add_cnt or the second refresh address Add_ins.

The non-volatile cell array 6100 includes a plurality of cell regions. Each of the plurality of cell regions may be designated by a row address. The cell regions are sequentially refreshed one by one according to a normal refresh operation (or a normal re-write operation), and while all of the cell regions are refreshed during a refresh period, an insertion refresh operation (or an insertion re-write operation) is performed on at least one specific cell region.

FIG. 12B is a circuit diagram of the non-volatile cell 6110 of FIG. 12A when the semiconductor memory device 6000 is MRAM. As illustrated in FIG. 12B, the non-volatile cell 6110 may include a cell resistor CR and a cell transistor CT which are embodied as an MTJ. A gate of the cell transistor CT is connected to a wordline WL, and one electrode of the cell transistor CT is connected to a bitline BL via the cell resistor CR. The other electrode of the cell transistor CT is connected to a source line SL. A direction in which a current flows via the MJT so as to store data in the non-volatile cell 6110 may be changed. For example, the current may be provided in a direction from the bitline BL toward the source line SL, or in a direction from the source line SL toward the bitline BL, so that the data may be stored in the non-volatile cell 6110.

Figure 13:
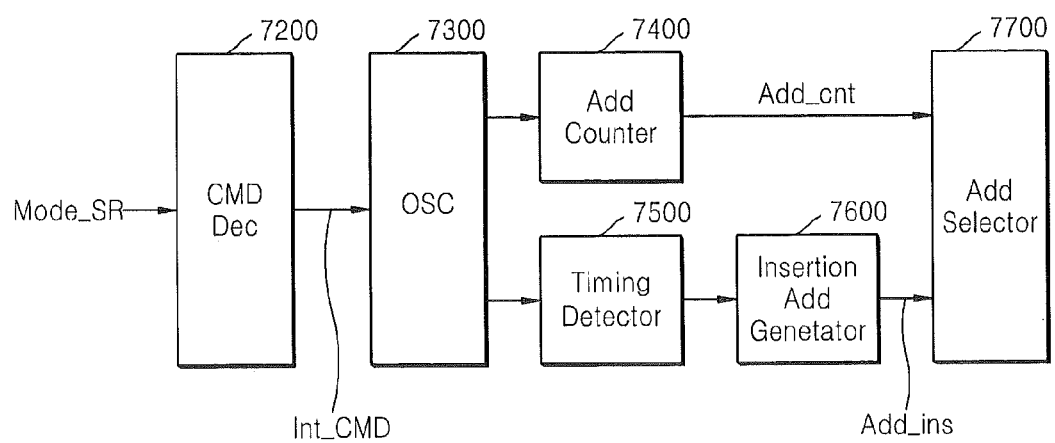
FIG. 13 is a block diagram of a semiconductor memory device that performs a normal refresh operation and an insertion refresh operation in a self-refresh mode, according to an embodiment of the inventive concept.

FIG. 13 is a block diagram of a semiconductor memory device 7000 that performs a normal refresh operation and an insertion refresh operation in a self-refresh mode, according to an embodiment of the inventive concept. As illustrated in FIG. 13, the semiconductor memory device 7000 may include a command decoder 7200, an oscillator 7300, an address counter 7400, a timing detector 7500, an insertion address generator 7600, and an address selector 7700.

When a command Mode_SR indicating a start of the self-refresh mode is received, the command decoder 7200 decodes the command Mode_SR, and outputs an internal command Int_CMD. The oscillator 7300 generates a clock signal having a predetermined clock period, in responds to the internal command Int_CMD. The address counter 7400 counts the clock signal and generates a first refresh address Add_cnt. The timing detector 7500 detects insertion refresh timing by counting the clock signal, and then outputs a detection result to the insertion address generator 7600. The insertion address generator 7600 stores one or more pieces of address information about one or more cell regions of an insertion refresh target, and outputs the stored address information as a second refresh address Add_ins. The address selector 7700 receives the first refresh address Add_cnt and the second refresh address Add_ins, and selectively outputs the first refresh address Add_cnt or the second refresh address Add_ins.

Figure 14A:
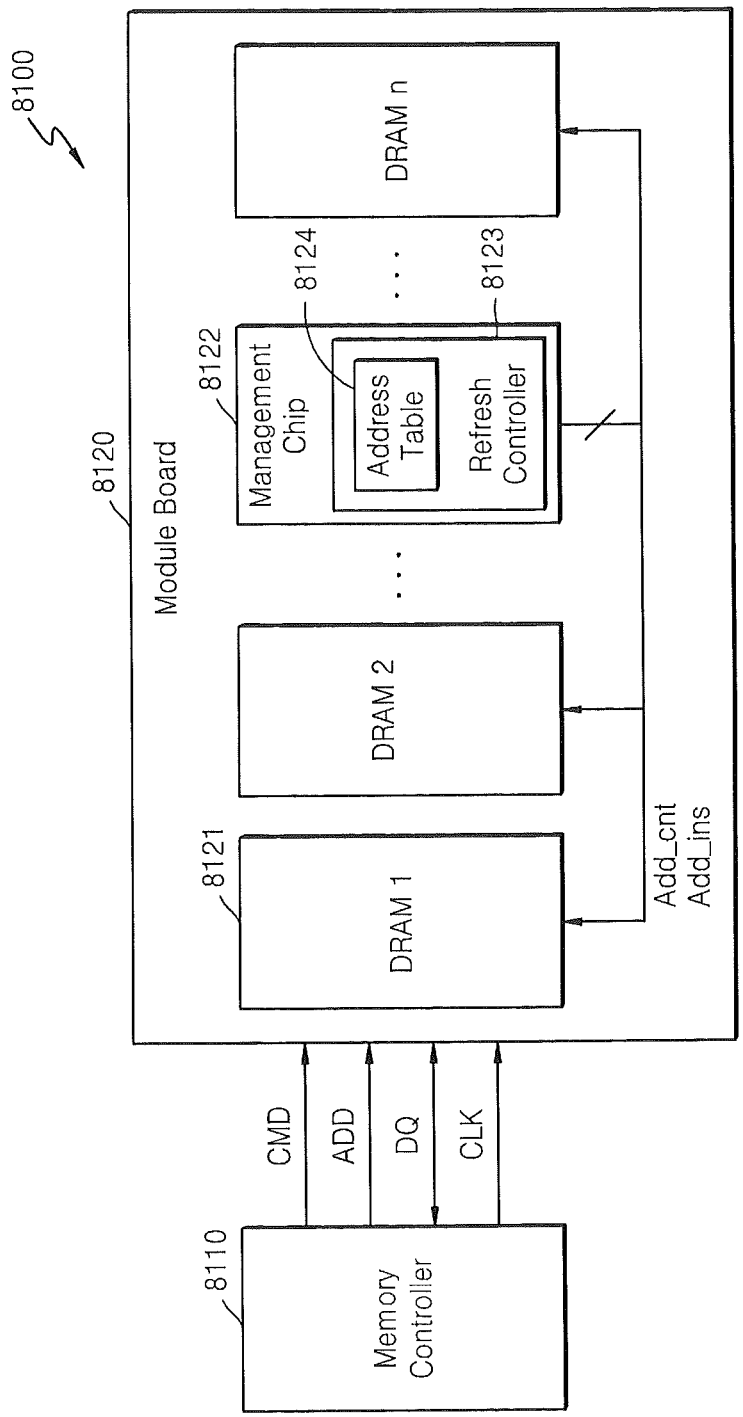
FIGS. 14A and 14B are block diagrams of a memory module and a memory system, according to an embodiment of the inventive concept.
Figure 14B:
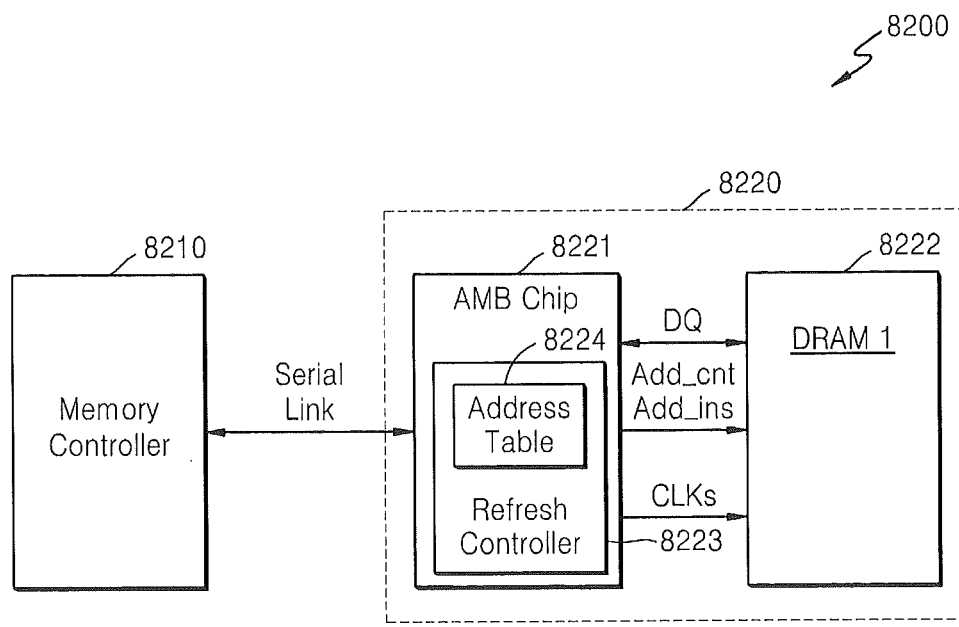

FIGS. 14A and 14B are block diagrams of a memory module 8120 and a memory system 8100, according to an embodiment of the inventive concept. As illustrated in FIG. 14A, the memory system 8100 includes a memory controller 8110 and the memory module 8120. The memory module 8120 includes one or more semiconductor memory devices 8121 that are mounted on a module board. For example, the semiconductor memory device 8121 may be a DRAM chip. A memory management chip 8122 may be further mounted on the module board so as to manage a memory operation of the semiconductor memory device 8121.

The memory controller 8110 provides various signals such as command and address signals CMD and ADD, and a clock signal CLK to control the semiconductor memory device 8121 included in the memory module 8120, and communicates with the memory module 8120 so as to provide a data signal DQ to the semiconductor memory device 8121 or to receive the data signal DQ from the semiconductor memory device 8121. The memory management chip 8122 manages the memory operation of the semiconductor memory device 8121, and manages refresh operations according to the embodiments of the inventive concept. In order to manage the refresh operations, the memory management chip 8122 may include a refresh controller 8123 and an address table 8124. The refresh controller 8123 may include one or more circuit blocks related to the refresh operations illustrated in FIGS. 1, 5A through 5D, and 6, so that an address table 8124 may be included in the refresh controller 8123. The address table 8124 stores an insertion address (e.g., the second refresh address Add_ins), and in this regard, the insertion address Add_ins is output from the address table 8124 at insertion refresh timing.

The refresh controller 8123 manages the refresh operations of the semiconductor memory device 8121. For example, in some embodiments, the refresh controller 8123 generates a counting signal in response to a refresh command from an external source or in response to a clock signal that is internally generated in a self-refresh mode, and outputs a normal address (e.g., the first refresh address Add_cnt) based on the counting signal to the semiconductor memory device 8121. Address information stored in the address table 8124 is accessed according to detection of the insertion refresh timing, and the accessed address information as the insertion address Add_ins is output to the semiconductor memory device 8121.

A cell region defined as a refresh unit may include cells arranged in the semiconductor memory device 8121 or may include cells arranged in a plurality of the semiconductor memory devices 8121. The cells of one of the plurality of the semiconductor memory devices 8121 or the cells of the plurality of the semiconductor memory devices 8121 may be refreshed via a normal address Add_cnt or an insertion address Add_ins. Alternatively, a cell region of only one semiconductor memory device 8121 may be selected and refreshed or cell regions of the plurality of the semiconductor memory devices 8121 may be simultaneously selected and refreshed via a normal address Add_cnt or one insertion address Add_ins.

FIG. 14B illustrates an example in which a memory module 8220 has a Fully-buffered dual in-line memory module (FBDIMM) form. As illustrated in FIG. 14B, a memory system 8200 includes a memory controller 8210 and the memory module 8220. The memory module 8220 includes at least one semiconductor memory device 8222 and an advanced memory buffer (AMB) chip 8221. The memory module 8220 in the FBDIMM form serially communicates with the memory controller 8210 in a manner that the AMB chip 8221 in the memory module 8220 is connected with the memory controller 8210 in a point-to-point way. For convenience of description, FIG. 14B illustrates only one memory module 8220. However, according to the FBDIMM technology, the number of the memory module 8220 connected to the memory system 8200 may be increased, so that the memory system 8200 may have a greater capacity, and because the FBDIMM technology uses a packet protocol, the memory system 8200 may operate at a high speed.

Various signals to control a memory operation are provided to the semiconductor memory device 8222 via the AMB chip 8221. The AMB chip 8221 may exchange a data signal DQ with the semiconductor memory device 8222 and may provide various addresses (e.g., the first refresh address Add_cnt and the second refresh address Add_ins) and clock signals CLKs to the semiconductor memory device 8222. In order to manage refresh operations of the semiconductor memory device 8222, the AMB chip 8221 may include a refresh controller 8223 and an address table 8224. As in the aforementioned embodiment, the AMB chip 8221 outputs a normal address (i.e., the first refresh address Add_cnt) in a normal refresh operation, and outputs an insertion address (i.e., the second refresh address Add_ins) in an insertion refresh operation.

Although FIGS. 14A and 14B illustrate the memory module having an LRDIMM form or the FBDIMM form, aspects of the inventive concept are not limited thereto. Embodiments of the inventive concept may be applied to memory modules having various forms. For example, embodiments of the inventive concept may be applied to memory modules such as a single in-line memory module (SIMM), a dual in-line memory module (DIMM), a small-outline DIMM (SO-DIMM), a Unbuffered DIMM (UDIMM), a Rank-buffered DIMM (RBDIMM), a mini-DIMM, a micro-DIMM, and the like.

Although FIGS. 14A and 14B illustrate the embodiments in which a signal between the memory controller and the memory module and a signal between the semiconductor memory device and the memory management chip in the memory module are transferred via a conductive line, aspects of the inventive concept are not limited thereto. For example, the signal between the memory controller and the memory module, the signal between the semiconductor memory device and the memory management chip, or a signal between a plurality of the semiconductor memory devices may be transferred via optical I/O connection. For example, a signal may be transmitted and received by using a radio frequency (RF) method, a radiative method, an inductive coupling method using magnetic induction, or a non-radiative method using a magnetic field resonance.

The radiative method delivers a signal in a wireless way by using an antenna such as a monopole or a planar inverted-F antenna (PIFA). A radiation occurs while an electric field and a magnetic field that change according to time are affected by each other, and when an antenna having the same frequency is used, it is possible to receive a signal according to a polarization characteristic of an incident wave.

The inductive coupling method generates a strong magnetic field in one direction by winding a coil several times, and then generates coupling by approaching a coil that resonates with a similar frequency.

The non-radiative method uses evanescent wave coupling that moves an electromagnetic wave between two mediums that resonate with the same frequency via a near-field electromagnetic field.

Figure 15:
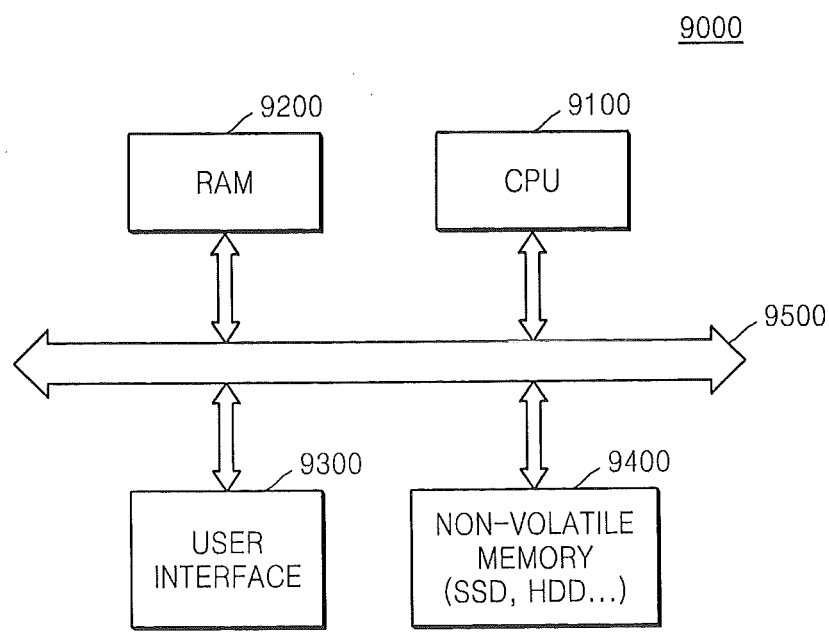
FIG. 15 is a block diagram of a computing system in which a semiconductor memory device is mounted, according to an embodiment of the inventive concept.

FIG. 15 is a block diagram of a computing system 9000 including a semiconductor memory device, according to an embodiment of the inventive concept. The semiconductor memory device according to the one or more embodiments of the inventive concept may be a RAM 9200 according to the one or more embodiments of the inventive concept, and may be mounted in an information processing system such as a mobile device or a desk top computer. Alternatively, the RAM 9200 of FIG. 15 may be a memory system including the semiconductor memory device and the memory controller.

The computing system 9000 includes a central processing unit 9100, the RAM 9200, a user interface 9300, and a non-volatile memory 9400 which are electrically connected to a bus 9500. The non-volatile memory 9400 may be formed as a large capacity storage device such as an SSD or an HDD.

In the computing system 9000, the RAM 9200 may include a DRAM chip, which includes DRAM cells, as the semiconductor memory device to store data. Data may be temporarily stored in the RAM 9200 so as to drive the computing system 9000, and then the RAM 9200 may periodically perform a refresh operation so as to retain the stored data. When the refresh operation is performed, a refresh period may be controlled in consideration of a memory characteristic (e.g., data retention characteristic) of the RAM 9200, and the control of the refresh period may be performed by varying the number of insertion refresh operations performed during the refresh period.

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
   a cell array; and
   a refresh controller coupled to the cell array and configured to insert additional insertion refresh addresses in a first refresh address sequence based on address information about the cell array to generate a second refresh address sequence and to apply the second refresh address sequence to the cell array at a fixed refresh rate, wherein the refresh controller comprises:
      an address generator configured to generate the insertion refresh addresses; and
      a timing detector configured to detect a timing for performing an insertion refresh by counting a number of refresh operations performed in the first refresh address sequence, to designate additional sequence locations for periodic insertion of successive ones of the insertion refresh addresses in the first refresh address sequence, and to control the address generator responsive thereto, wherein the designated additional sequence locations are distributed at uniform intervals within the second refresh address sequence.

2. The semiconductor memory device of claim 1, wherein the refresh controller further comprises an address selector configured to receive the first refresh address sequence and the insertion refresh addresses and to selectively output the insertion refresh addresses and addresses from the first refresh address sequence responsive to the timing detector.

3. The semiconductor memory device of claim 1, wherein the timing detector comprises:
   a first counter configured to perform a counting operation in response to a refresh control signal and to output a first signal when a first value is counted; and
   a second counter configured to perform a counting operation in response to the first signal and to output a second signal to access address information stored by the address generator.

4. The semiconductor memory device of claim 1, wherein the refresh controller is configured to store an address of a cell region having a relatively inferior data retention characteristic and to output the stored address information as an insertion refresh address.

5. The semiconductor memory device of claim 1, wherein the refresh controller is further configured to store master information indicating whether to perform an insertion refresh operation.

6. The semiconductor memory device of claim 5, wherein the refresh controller further comprises an enable controller configured to receive the master information and to enable and disable refresh address insertion according to a state of the master information.

7. The semiconductor memory device of claim 1, wherein the cell array comprises N-cell groups, and each of the N-cell groups comprises a plurality of cell regions, wherein the refresh controller is configured to store address information about a number of cells less than N and, during one refresh period, to refresh each cell of an N-cell group at least once and refresh less than N cells at least twice.

8. The semiconductor memory device of claim 7, wherein each of the plurality of cell regions is a page that is selected in response to one row address.

9. The semiconductor memory device of claim 1, wherein the refresh controller further comprises:
   a command decoder configured to generate an internal refresh command by decoding an external command; and
   a refresh control circuit generating a refresh control signal in response to the internal refresh command.

10. A semiconductor memory device comprising:
    a memory cell array comprising at least one N-cell region;
    an address counter configured to generate at least one first refresh address designating the at least one N-cell region for a refresh operation;
    an address generator configured to generate a second refresh address designating at least one cell region of the at least one N-cell region for the refresh operation;
    a timing detector configured to detect an output timing for the second refresh address by counting a number of refresh operations performed by using the first refresh address, wherein the timing detector is configured to:

count a number of refresh operations performed in a first refresh address sequence; and designate a sequence location of an insertion of the second refresh address with respect to the first refresh address sequence at one of a plurality of periodic positions in the first refresh address sequence; and an address selector configured to receive the first and second refresh addresses and to selectively output the first and second refresh addresses during the refresh operation, wherein the address selector is configured to selectively output the first refresh address and the second refresh address responsive to the output of the timing detector.

11. The semiconductor memory device of claim 10, wherein the address generator comprises:

an address table configured to store the second refresh address and to output the second refresh address responsive to an output of the timing detector.

12. The semiconductor memory device of claim 11, wherein the address selector is configured to selectively output the first refresh address and the second refresh address responsive to the output of the timing detector.

13. The semiconductor memory device of claim 10, wherein the address generator is configured to store second refresh addresses corresponding to A cell regions of the at least one N-cell region and wherein the address selector is configured to output N first refresh addresses and A second refresh addresses during the refresh operation.

14. A refreshing method performed by a semiconductor memory device comprising a plurality of cell regions, the refreshing method comprising:

outputting a plurality of first addresses based on a counting operation and a plurality of second addresses from a storing unit that stores address information about at least one cell region from among the plurality of cell regions;

performing a plurality of first refresh operations on a first cell group comprising N cell regions by using a first portion of the plurality of first addresses based on a counting operation;

performing a second refresh operation according to a periodic interval on the at least one cell region by using one of the second addresses;

performing a plurality of first refresh operations on a second cell group comprising other ones of the N cell regions by using a second portion of the plurality of first addresses; and performing a second refresh operation according to the periodic interval on another cell region by using another one of the second addresses after performing the plurality of first refresh operations on the second cell group;

wherein alternate performing of first refresh operations on the plurality of cell regions by using the plurality of first addresses and second refresh operations on a selected portion of the plurality of cell regions by using the second addresses is completed in a refresh period.

15. The refreshing method of claim 14, wherein, during a refresh period, a first refresh operation on the plurality of cell regions and a second refresh operation on some of the plurality of cell regions are performed.

16. The refreshing method of claim 14, wherein a refresh period value of the repeating periodic interval varies according to the number of cell regions on which the second refresh operation is performed.

17. The refreshing method of claim 14, further comprising:

receiving an external command for a start of an refresh mode; and decoding the external command, thereby generating a refresh control signal, wherein the first address is generated by counting the refresh control signal.

18. The refreshing method of claim 17, further comprising:

generating a detection signal to detect timing to output the second address by counting the refresh control signal; and generating a table address to access the storing unit by counting the detection signal, wherein the storing unit outputs a second address that corresponds to the table address.

19. The refreshing method of claim 14, wherein each of the plurality of cell regions is a page that is selected in response to one row address.

20. The semiconductor memory device of claim 1, wherein a period used to calculate the periodic insertion of the plurality of insertion refresh addresses is N divided by A, wherein N represents a number of cell regions in the cell array requiring a refresh operation, wherein A represent a number of a plurality of cell regions in the cell array having a relatively inferior data retention characteristic.

21. The semiconductor memory device of claim 10, wherein a period used to calculate the plurality of periodic positions for the sequence location of the insertion of the second refresh address is N divided by A, wherein A represents a number of a plurality of cell regions in the at least one N-cell region having a relatively inferior data retention characteristic.

22. The semiconductor memory device of claim 14, wherein a period used to calculate the periodic interval for the second refresh operation on the at least one cell region is N divided by A, wherein A represents a number of a plurality of cell regions in the N cell regions having a relatively inferior data retention characteristic.

* * * * *